United States Patent
Kelly et al.

(10) Patent No.: US 11,863,876 B2
(45) Date of Patent: Jan. 2, 2024

(54) EVENT-BASED COMPUTATIONAL PIXEL IMAGERS

(71) Applicant: Anduril Industries, Inc., Irvine, CA (US)

(72) Inventors: Michael W. Kelly, North Reading, MA (US); Curtis Colonero, Shrewsbury, MA (US); Christopher David, Chelmsford, MA (US); Justin Baker, Andover, MA (US); William Ross, Westford, MA (US)

(73) Assignee: Anduril Industries Inc., Costa Mesa, CA (US)

( * ) Notice: Subject to any disclaimer, the term of this patent is extended or adjusted under 35 U.S.C. 154(b) by 0 days.

(21) Appl. No.: 17/425,747

(22) PCT Filed: Feb. 4, 2020

(86) PCT No.: PCT/US2020/016586
§ 371 (c)(1),
(2) Date: Jul. 26, 2021

(87) PCT Pub. No.: WO2020/163335
PCT Pub. Date: Aug. 13, 2020

(65) Prior Publication Data
US 2022/0166948 A1  May 26, 2022

Related U.S. Application Data

(60) Provisional application No. 62/807,683, filed on Feb. 19, 2019, provisional application No. 62/800,685, filed on Feb. 4, 2019.

(51) Int. Cl.
*H04N 23/741* (2023.01)
*G06T 7/194* (2017.01)
(Continued)

(52) U.S. Cl.
CPC ............ *H04N 23/741* (2023.01); *G06T 3/40* (2013.01); *G06T 7/194* (2017.01); *G06T 7/60* (2013.01);
(Continued)

(58) Field of Classification Search
None
See application file for complete search history.

(56) References Cited

U.S. PATENT DOCUMENTS 6,674,887 B1   1/2004   Wu
11,567,308 B2  1/2023   D'Angelo
(Continued)

FOREIGN PATENT DOCUMENTS

CN   1659860      6/2010
JP   2001289951  10/2001

OTHER PUBLICATIONS

Blanquart L et al., "XPAD, a new read-out pixel chip for X-ray counting", Nuclear Science Symposium Conference Record, 2000 IEEE Lyon, France, vol. 2, Oct. 15, 2000, pp. 9 92-9 97.
(Continued)

*Primary Examiner* — Mark T Monk
(74) *Attorney, Agent, or Firm* — Van Pelt, Yi & James LLP

(57) ABSTRACT

A computational pixel imaging device that includes an array of pixel integrated circuits for event-based detection and imaging. Each pixel may include a digital counter that accumulates a digital number, which indicates whether a change is detected by the pixel. The counter may count in one direction for a portion of an exposure and count in an opposite direction for another portion of the exposure. The imaging device may be configured to collect and transmit key frames at a lower rate, and collect and transmit delta or event frames at a higher rate. The key frames may include
(Continued)

a full image of a scene, captured by the pixel array. The delta frames may include sparse data, captured by pixels that have detected meaningful changes in received light intensity. High speed, low transmission bandwidth motion image video can be reconstructed using the key frames and the delta frames.

16 Claims, 18 Drawing Sheets

(51) Int. Cl.
| | |
|---|---|
| G06T 3/40 | (2006.01) |
| G06T 7/60 | (2017.01) |
| H04N 23/11 | (2023.01) |
| H04N 23/51 | (2023.01) |
| H04N 23/56 | (2023.01) |
| H04N 23/71 | (2023.01) |
| H04N 23/74 | (2023.01) |
| H04N 23/957 | (2023.01) |
| H04N 25/75 | (2023.01) |
| H04N 25/767 | (2023.01) |
| H04N 25/772 | (2023.01) |
| H01L 27/146 | (2006.01) |

(52) U.S. Cl.
CPC ............. *H04N 23/11* (2023.01); *H04N 23/51* (2023.01); *H04N 23/56* (2023.01); *H04N 23/71* (2023.01); *H04N 23/74* (2023.01); *H04N 23/957* (2023.01); *H04N 25/75* (2023.01); *H04N 25/767* (2023.01); *H04N 25/772* (2023.01); *H01L 27/14681* (2013.01)

(56) References Cited

U.S. PATENT DOCUMENTS

| | | | |
|---|---|---|---|
| 2002/0033445 A1 | 3/2002 | Mattison | |
| 2003/0189657 A1 | 10/2003 | Hammadou | |
| 2004/0141587 A1 | 7/2004 | Arques | |
| 2007/0182949 A1 | 8/2007 | Niclass | |
| 2011/0235771 A1 | 9/2011 | Aull | |
| 2013/0003911 A1 | 1/2013 | Schultz | |
| 2013/0258152 A1 | 10/2013 | Balannik | |
| 2014/0009581 A1 | 1/2014 | Cheng | |
| 2014/0034809 A1 | 2/2014 | Jie | |
| 2015/0288890 A1 | 10/2015 | Senda | |
| 2016/0227135 A1 | 8/2016 | Matolin | |
| 2016/0266242 A1 | 9/2016 | Gilliland | |
| 2017/0041571 A1 | 2/2017 | Tyrrell | |
| 2017/0261611 A1 | 9/2017 | Takahashi | |
| 2018/0067237 A1 | 3/2018 | Vandame | |
| 2018/0203217 A1 | 7/2018 | Knebel | |
| 2018/0214057 A1 | 8/2018 | Schultz | |
| 2018/0246212 A1 | 8/2018 | Moore | |
| 2018/0299535 A1 | 10/2018 | Jew | |
| 2018/0302562 A1* | 10/2018 | Newcombe | H04N 23/667 |
| 2019/0109973 A1 | 4/2019 | Riza | |
| 2020/0284883 A1 | 9/2020 | Ferreira | |
| 2022/0166948 A1 | 5/2022 | Kelly | |

OTHER PUBLICATIONS

Cristiano Niclass et al., "Single-Photon Synchronous Detection", IEEE Journal of Solid-State Circuits, IEEE, USA, vol. 44, No. 7, Jul. 1, 2009, pp. 1977-1989.

Kiyoharu Aizawa et al., "Computational Image Sensor for on Sensor Compression", IEEE Transactions on Electron Devices, IEEE Service Center, Piscataway, NJ, US vol. 44, No. 10; Oct. 1, 1997.

Danilo Bronzi et al., "Automotive Three-Dimensional Vision Through a Single-Photon Counting SPAD Camera", IEEE Transactions on Intelligent Transportation Systems, vol. 17, No. 3, Mar. 1, 2016 (Mar. 1, 2016), pp. 782-795.

Nirzhar Saha et al., "Survey on optical camera communications: challenges and opportunities", IET Optoelectronics, The Institution of Engineering and Technology, vol. 9, No. 5, Oct. 1, 2015 (Oct. 1, 2015), pp. 172-183.

Soo-Yong Jung et al., "TDOA-based optical wireless indoor localization using LED ceiling lamps", IEEE Transactions on Consumer Electronics, IEEE Service Center, vol. 57, No. 4, Nov. 1, 2011 (Nov. 1, 2011), pp. 592-1597.

Bronzi e al.: "SPADAS: a high-speed 3D single-photon camera for advanced driver ssistance systems", Proceedings of SPIE, IEEE, US, vol. 9366, Feb. 27, 2015 (Feb. 27, 2015), pp. 93660M-93660M.

* cited by examiner

EVENT-BASED COMPUTATIONAL PIXEL IMAGERS

CROSS REFERENCE TO RELATED APPLICATIONS

This application is a national stage filing under 35 U.S.C. § 371 of International Patent Application Serial No. PCT/US2020/016586, filed Feb. 4, 2020, and titled "Event-Based Computational Pixel Imagers", which claims priority to U.S. provisional application No. 62/800,685 filed on Feb. 4, 2019 and titled "Multi-Function Time Multiplexed Camera," the entire content of which is incorporated herein by reference. This application also claims priority to U.S. provisional application No. 62/807,683 filed on Feb. 19, 2019 and titled "Event-Based Vision And Inter-Frame Video Compression." The entire contents of these applications are which is incorporated herein by reference.

FIELD

The described apparatus and methods relate to imaging arrays that include integrated circuitry for in-pixel data-processing.

BACKGROUND

The majority of conventional integrated-circuit imaging arrays are either charge-coupled devices (CCDs) or complementary metal-oxide semiconductor (CMOS) devices. In such imaging arrays, photocurrent generated by illumination of a photodiode accumulates charge on a capacitor at each pixel of the array. At the end of an exposure period, the amount of charge stored on the pixel's capacitor is read out of the array for subsequent image processing.

Recently, digital focal plane arrays have been developed as a different approach to imaging. These arrays include pixel circuitry that can digitize detected signals and perform some signal processing operations within the array pixels.

SUMMARY

The present invention relates to advanced imaging arrays that include integrated circuits within each pixel to digitize detected signals and to perform advanced signal-processing functions.

Some embodiments relate to a computational pixel imaging apparatus for event-based imaging. The imaging apparatus can include a plurality of pixels, each pixel comprising a signal converter configured to convert a received analog signal representative of received radiation to a sequence of pulses and a first counter configured to, in response to the sequence of pulses, increment a digital number for a first portion of the exposure period and decrement the digital number for a second portion of the exposure period to accumulate a resulting first digital number. The imaging apparatus can further comprise logic circuitry configured to identify one or more pixels of the plurality of pixels that have detected changes in the received radiation based, at least in part, on one or more resulting first digital numbers on one or more of the first counters.

Some embodiments relate to a computational pixel imaging apparatus that comprises a plurality of pixels. Each pixel can comprise a detector configured to generate an analog signal when exposed to radiation and a pixel integrated circuit configured to convert the analog signal into at least one digital signal with at least one counter. Further, the plurality of pixels are configured to acquire a plurality of key frames at a first frequency in response to exposure of the detectors of the plurality of pixels for a first-type exposure, and acquire a plurality of delta frames at a second frequency in response to exposure of the detectors of the plurality of pixels for a second-type exposure, wherein the second frequency is higher than the first frequency.

Some embodiments relate to a method for detecting events with a computation pixel imager. The method can include acts of receiving photons at a detector in a pixel of the imager and generating an analog signal; converting, with a signal converter, the analog signal to a sequence of pulses; incrementing a count value with a counter for a first duration of time based on received pulses from the sequence of pulses; decrementing the count value to a resulting digital number with the counter for a second duration of time based on received pulses from the sequence of pulses; comparing the resulting digital number with a threshold value or range of values; and if the resulting digital number exceeds the threshold value or is outside the range of values, retain the retain the resulting digital number on the counter in the pixel for read out.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the present invention will become more apparent from the detailed description set forth below when taken in conjunction with the drawings.

DETAILED DESCRIPTION

Figure 1A:
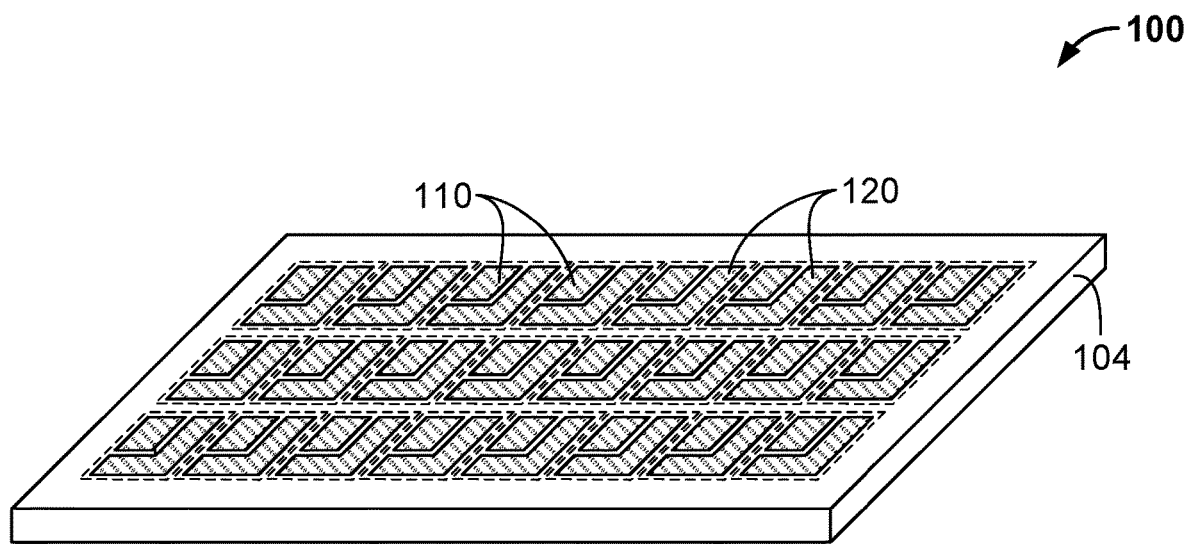
FIG. 1A depicts a computational pixel imaging device, according to some embodiments.

Imaging arrays that include in-pixel digitization circuitry are emerging as useful alternatives to conventional CMOS and CCD imaging arrays for some applications. An example of a computational pixel imaging device 100 is depicted in FIG. 1A. According to some embodiments, a computational pixel imaging device 100 can include a substrate 104 on which is formed an array of detectors 110 and an array of pixel integrated circuits 120 that are arranged to receive signals from the corresponding detectors. A detector 110 and its corresponding pixel integrated circuit 120 can form a pixel of a computational pixel imaging device 100, and may both be located on a same substrate 104 in some embodiments. The arrays depicted in FIG. 1A are two-dimensional and may comprise tens, hundreds, thousands, or even millions of pixels when implemented in a device. In some cases, the arrays may be one-dimensional (e.g., for a device that is scanned).

Figure 1B:
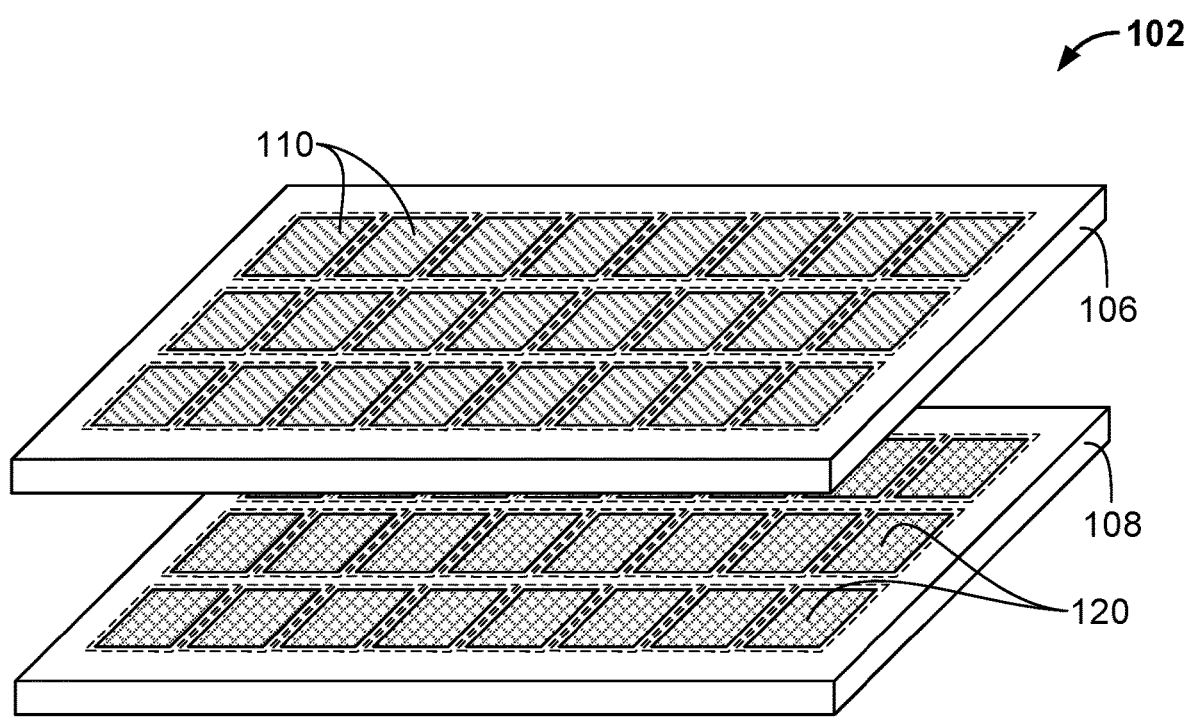
FIG. 1B depicts a computational pixel imaging device, according to some embodiments.

FIG. 1B depicts an embodiment of a computational pixel imaging device 102 in which the detectors 110 are formed on a first substrate 106 in a detector array and the pixel integrated circuits 120 are formed on a second substrate in a pixel integrated circuit array. In some embodiments, the detectors 110 on the first substrate 106 can be directly connected to receiving pixel integrated circuits 120 on the second substrate 108 (e.g., by flip-chip or bump-bonding processes that may include solder bumps or posts). In some implementations, the detectors 110 on the first substrate 106 may be connected to receiving pixel integrated circuits 120 on the second substrate 108 through an interposer located between the substrates and not shown in the drawing. The interposer may provide some signal rerouting so that the array of pixel integrated circuits 120 on the second substrate may be larger than the array of detectors 110 on the first substrate. However, in some cases the pixel size for a pixel integrated circuit 120 may be the same or smaller than a pixel size for a detector 110.

The first substrate 106 may be made from a first material that can be the same or different from a second material used to form the second substrate 108. For example, the first substrate 106 may be made from a first semiconductor material (e.g., indium phosphide (InP)) and the second substrate may be made from a second semiconductor material (e.g., silicon (Si)). Other materials from which the substrates in FIG. 1A and FIG. 1B may be formed and/or that may be included on the substrates include, but are not limited to, II-VI semiconductors such as cadmium telluride (CdTe) and mercury-cadmium telluride (HgCdTe), III-V semiconductors such as gallium nitride (GaN) and compositions including GaN, gallium arsenide (GaAs) and compositions including GaAs, and group IV semiconductors such as Si, germanium (Ge), or silicon-germanium (SiGe).

Various types of detectors 110 may be used in a computational pixel imager 100, 102. In some embodiments, the detectors 110 may comprise p-n or p-i-n junction photodiodes or phototransistors or photoconductors. Barrier detectors (e.g., barrier photodiodes, barrier phototransistors, etc.) may also be used in some cases and provide high detection sensitivity. In some cases, the detectors 110 may comprise avalanche photodiodes for sensing low light levels. In yet other embodiments, the detectors 110 may comprise microbolometers. According to some embodiments, the detectors 110 may be cooled to reduce background noise and/or to enhance responsivity of the detectors. For example, the computational pixel imager 100, 102 may be mounted on a thermoelectric cooler or placed in thermal contact with a chilled heat sink or located in a dewer.

Figure 2:
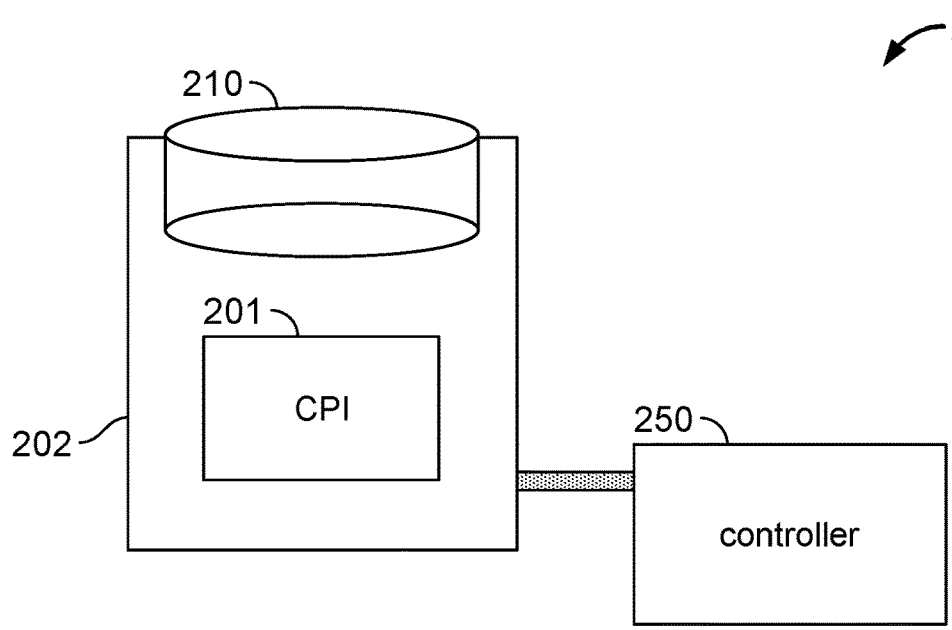
FIG. 2 depicts an imaging system that may include a computational pixel imaging device, according to some embodiments.

A computational pixel imager 201 may be included in an imaging system 200 as illustrated in FIG. 2, according to some embodiments. An imaging system 200 can include a camera 202 that may house collection optics 210 and a computational pixel imager 201. The imaging system 200 may also include a controller 250 that can connect to the camera 202 and computational pixel imager 201 by a wired or wireless data-communication link. The collection optics 210 may include one or more lenses and/or mirrors that act to form an image of a viewed scene on detectors 110 in the computational pixel imager 201. The detectors 110 may be located in an imaging plane of the collection optics 210 and an array of pixel integrated circuits 120 may be located in the imaging plane or adjacent to the imaging plane. In some embodiments, some component(s) of the collection optics 210 may be moved controllably and automatically, the imager 201 may be moved controllably and automatically, and/or the entire camera 202 may be moved controllably and automatically (e.g., rotated by motors or actuators) to scan and image a large field of view.

The imaging system 200 may be adapted as a visible imaging system, an infrared imaging system (e.g., a night-vision system), an ultraviolet imaging system, or an x-ray imaging system. The choice of detector design and material can determine the responsivity of the detector to various wavelengths of radiation. For example, Si-based photodiodes can be used for a visible imaging system (e.g., wavelengths from about 380 nm to about 740 nm), whereas CdTe photodiodes may be used for ultraviolet or x-ray imaging systems. As another example, indium arsenide or HgCdTe photodiodes may be used for an infrared imaging system. In some cases, strained-layer superlattice detectors formed from III-V materials can be used for infrared imaging. In some cases, detector design and material can be chosen to detect radiation within a spectral range that lies within a portion of an infrared wavelength range between 750 nm or approximately 750 nm and 5 microns or approximately 5 microns. For example and in some implementations, a detector can be selected to detect radiation in an infrared spectral range between 0.75 micron and 3 microns or between approximately these end values. In some implementations, a detector can be selected to detect radiation in an infrared spectral range between 3 microns and 5 microns or between approximately these end values.

In some implementations, the controller 250 can be implemented in various ways and forms. For example, the controller 250 may be embodied as a field programmable gate array (FPGA), a mainframe computer, or anything in between such as a microcontroller, a microprocessor, one or more application-specific integrated circuits, a digital signal processor, a laptop computer or desktop computer, a tablet computer, a smart phone, etc. In some cases, the controller 250 can be embodied as combinations of different controlling devices. Part of the control components can include code as software and/or firmware that adapts the controller 250 to execute functionalities that control operation of the imaging system 200 and receive, store, transmit, and process image data acquired by the camera 202. Controller components may also include custom logic and/or analog circuitry as well as memory that can be used by the computational pixel imager. The controller 250 may be configured to initiate the transfer of digital signals from the pixel integrated circuits 120 and to control the shifts, counts, and accumulation times that can permit the pixel integrated circuits 120 to perform digital-signal-processing functions on-chip. In some cases, some control functions may be incorporated into the pixel integrated circuits 120 (e.g., hardwired or implemented as firmware). Such an integration may permit an array of pixel integrated circuits 120 to operate autonomously and perform on-chip, digital-signal-processing functions relatively free of external control.

An imaging system 200 in accordance with the present embodiments may be used, for example, in industrial inspection, surveillance, process control, biological research, chemical research, pharmaceuticals, medical imaging, remote sensing, and astronomy. An implementation that comprises a computational pixel imager 201 and single-chip controller 250 may be incorporated in a variety of cameras, including portable, consumer, still and motion cameras, for example. A camera may be configured to operate in the visible region of the optical spectrum or in other wavelength regions by selecting appropriate detectors 110. In some embodiments, a computational pixel imager 201 and controller 250 may be incorporated into a vision system for autonomous vehicles or robotic instruments.

In the infrared range, an imaging system 200 may be adapted for operation as an infrared camera and used for industrial sensing (e.g., monitor heat emission from industrial components and/or machines), security, or firefighting, for example. An infrared camera may also be employed to provide an infrared image of a scene ahead of and/or around a vehicle. In some implementations, the imaging capability of the camera can extend beyond the human visible range of a scene illuminated by vehicle headlights. An acquired infrared image may be displayed, for example in a "heads up" display or overlaid on a windscreen of the vehicle to assist the vehicle operator. Potential hazards that are not visible to the unaided eye can become visible to a human operator through the camera and display.

In some implementations, an imaging system 200 can include a cryogenically cooled infrared detector array, with connections between the detector array and the pixel integrated circuit array made via indium bump bonding, for example. In such an embodiment, the detector array may be suitable for low-light-level, low noise sensing in the infrared region of the spectrum (2-20 microns). Cooling may also be employed for detectors used in the visible and ultraviolet regions of the optical spectrum.

Figure 3A:
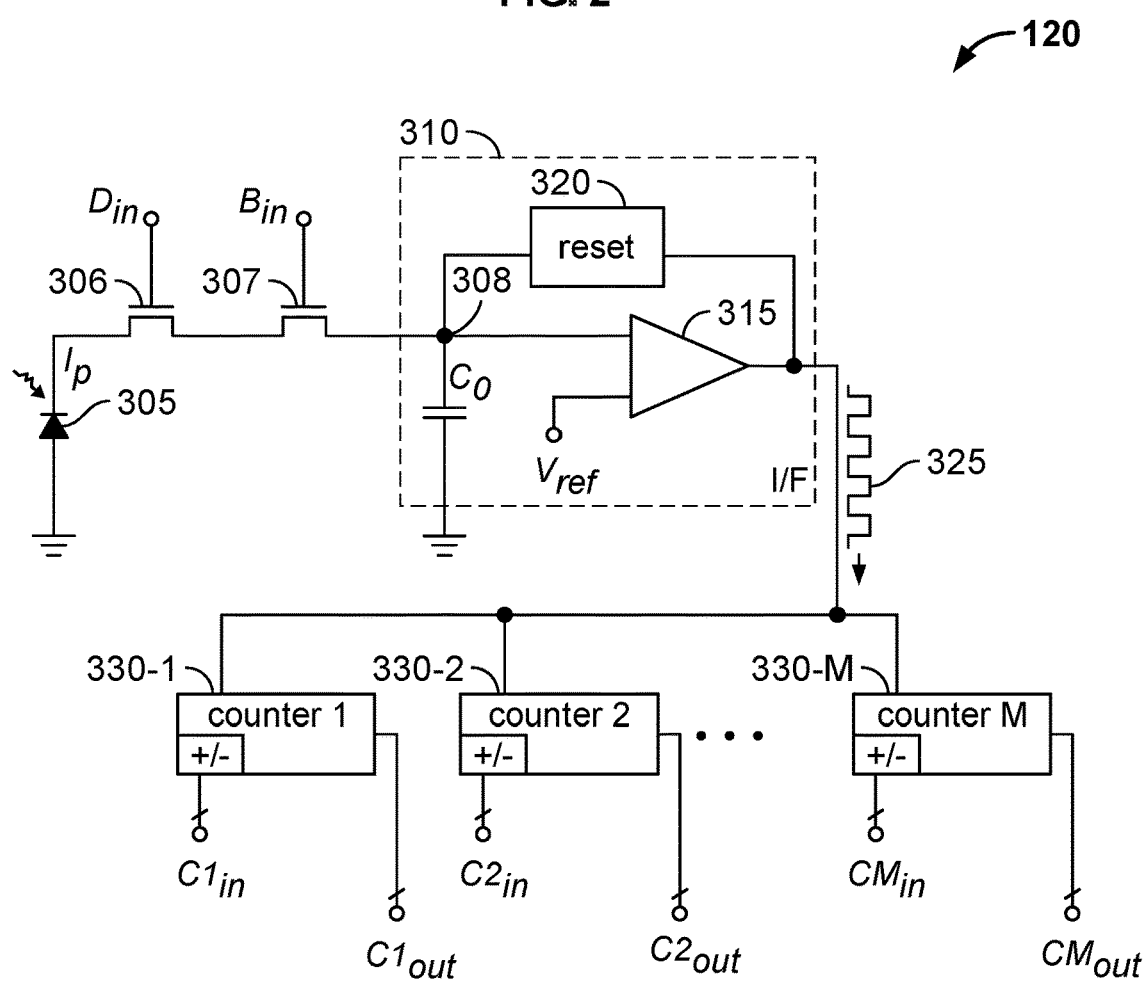
FIG. 3A depicts an example of pixel circuitry for a computational pixel imaging device, according to some embodiments.

An example of a pixel integrated circuit 120 is depicted in FIG. 3A. According to some embodiments, a pixel integrated circuit 120 can include a first transistor 306, a capacitor $C_O$, which may be included in a current-to-frequency converter 310, and at least one digital counter 330-1. In some cases, a second transistor 307 may be included between the first transistor 306 and current-to-frequency converter 310. The second transistor 307 can provide additional isolation between node 308 or input to the current-to-frequency converter 310 and the source of the first transistor 306. The second transistor 307, connected in cascade, can help dampen noise arising from reset actions performed on node 308. In some implementations, there can be two or more counters 330-1, 330-2, . . . 330-M as illustrated in the drawing. The current-to-frequency converter 310 can be arranged to receive as input an analog signal and output a pulse every time a current exceeds a threshold value. The pulses can be counted by the counters 330-1, 330-2, . . . 330-M. When located above or below a detector 110 in a pixel, an area occupied by a pixel integrated circuit 120 may be approximately the same size or smaller than an area occupied by the detector. In some implementations, a voltage-to-frequency converter may be used instead of a current-to-frequency converter. For example, a voltage-to-frequency converter may sense a voltage appearing on a node 308 of a capacitor $C_O$ and output a pulse every time a voltage exceeds a threshold value.

In further detail, a detector (which may be embodied as a photodiode 305) can generate a photocurrent $I_p$ when exposed to radiation. In some embodiments, the detector (photodiode 305) may receive a stable bias from a bias source. For example, biasing circuity can be included to apply a bias the photodiode 305 from a voltage source. The circuitry may include a large inductor on a bias line to block time-varying signals from the photodiode and pass a DC bias voltage. It may be advantageous to maintain a stable bias on the detector, and the second transistor 307 can help reduce bias variations that might otherwise occur due to resetting action at node 308.

In some implementations, passage of the photocurrent $I_p$ to a capacitor $C_O$ of the current-to-frequency converter 310 may be controlled by the first transistor 306 (and/or second transistor 307) with the application of a digital control signal $D_{in}$ (and/or $B_{in}$), for example. According to some embodiments, the control signal $D_{in}$ (and/or $B_{in}$) may determine an exposure period for a pixel of the computational pixel imager. For example, when the control signal $D_{in}$ (and $B_{in}$) is at a logic "HIGH" or "1" level, photocurrent $I_p$ can flow and accumulate charge on capacitor $C_0$ raising the voltage at node 308. Toggling the first transistor 306 and/or second transistor 307 to a logic "LOW" or "0" level can block further photocurrent flow to the capacitor $C_0$, and can terminate an exposure period. The exposure period can be repeated for video imaging and can be any suitable duration. In some embodiments, the exposure period may be any duration of time between 1 nanosecond (1 ns) for high levels of radiation on the detector and tens of minutes for low levels of radiation or for high-dynamic range sensing. Each exposure period can form an image frame with signals received from all pixels in the imager's array.

In other implementations, the first transistor 306 (or transistors as described further below) may be used to provide gain and at least one of the transistors 306, 307 may be biased to operate in a sub-threshold region. In such embodiments, the first transistor(s) may or may not be used to shutter an exposure period. In some cases, shutter action for exposure periods can be accomplished by control signals (or clock signals) provided to the counters 330-1, 330-2, . . . 330-M that instruct one or more counters when to start and stop accumulating counts.

Although the input transistor(s) 306, 307 can be arranged as a switch (as in FIG. 3A) for direct photocurrent injection, in some cases the input transistor(s) may be arranged in other configurations and two or more transistors may be used to receive photocurrent from the photodiode 305. For example, one or more transistors may be arranged to amplify a signal from the photodiode 305. Input transistor(s) may be connected as a source-follower, a transimpedence amplifier, or configured for buffered direct injection of the photocurrent $I_p$. In some implementations, a current mirror circuit may be included in an input transistor arrangement, wherein the current mirror circuit provides current gain in a circuit branch that runs parallel to the branch containing the photodiode 305 and first transistor 306. The amplified current can be provided to the capacitor $C_0$ and current-to-frequency converter 310. Although the input transistor(s) 306, 307 are depicted as a field-effect transistor (FET), bipolar junction transistors (BJTs) and other types of transistors may be used in some embodiments.

The capacitor $C_0$ may have one terminal connected to an output of the first transistor 306 (or second transistor 307, if present) and a second terminal connected to a reference potential (e.g., ground as illustrated). The capacitance of capacitor $C_0$ can be small (e.g., between 1 femtoFarad (1 fF) and 1 nanoFarad (1 nF)). Higher or lower capacitance values may be used in other embodiments. In some cases, capacitor $C_0$ can be embodied as parasitic capacitance of a discrete circuit device (e.g., parasitic drain capacitance of the first transistor 306 or second transistor 307, if present), and may not be a separate discrete component in the integrated pixel circuit 120. The capacitor $C_0$ can determine the least significant bit value for a signal level from a pixel. Although FIG. 3A depicts one polarity for applying (sourcing) current to the current-to-frequency converter 310, in some cases it may be beneficial to reverse the orientation of the photodiode 305 or detector and sink current from the current-to-frequency converter 310. The use of appropriate types (n-MOS or p-MOS) of transistors can allow a pixel integrated circuit to accommodate a current source or current sink photodetection strategy. Current applied to the current-to-frequency converter 310 may charge or discharge a capacitor $C_0$. For example, in some cases a reset of the capacitor may comprise applying a non-zero voltage to node 308, which can leave a potential across the capacitor $C_0$ that is discharged, at least in part, by subsequent exposure of the photodiode 305.

The current-to-frequency converter 310 can include comparator circuitry 315 and reset circuitry 320, according to some embodiments. Comparator circuitry 315 can be embodied as a Schmitt trigger, comparator, or high-gain amplifying transistor that toggles between two output states: for example, from a low level to high, or high level to low, when an input voltage exceeds (or falls below) a reference voltage $V_{ref}$. In some implementations, the reference voltage may be hardwired to a fixed value or may be a threshold voltage of a transistor. In other cases, the reference voltage $V_{ref}$ may be programmable by an external control signal to two or more values. For example, an integrated pixel circuit 120 may further include transistors (and resistive elements in some cases) arranged to provide programmable voltage values. Reset circuitry 320 may be embodied as one or more transistors arranged to discharge the capacitor $C_0$ (e.g., shunt the capacitor's terminal connected to node 308 to the reference voltage connected to the other terminal of the capacitor. For example, a toggling of an output from the comparator circuitry 315 can activate the reset circuitry 320 to discharge the capacitor $C_0$, which can cause the comparator circuitry 315 to toggle back to a prior state of the two states. In some implementations, the current-to-frequency converter 310 may be embodied as described in connection with FIG. 3 of U.S. Pat. No. 10,348,993, the entire contents of which is incorporated herein by reference.

As a result of toggling of the comparator circuitry 315 and resetting of the capacitor $C_0$, an output of pulses 325 can be provided to one or more counters 330-1, 330-2, . . . 330-M during an exposure period. The number of pulses during an exposure period will depend upon and be proportional to an amount of radiation incident on the detector (photodiode 305 in the illustrated embodiment). A higher level of radiation will produce a larger number of pulses during the exposure period. One or more of the counters 330-1, 330-2, . . . 330-M can accumulate counts for the pulses received during the exposure period. At the end of the exposure period, the number of counts can be read out of a counter as a digital signal level for the pixel. The digital signal level will be indicative of an intensity of radiation received by the detector at the pixel.

The counters 330-1, 330-2, . . . 330-M can be implemented with transistors arranged as logic gates, according to some embodiments. For example, a counter can be formed from flip-flop logic circuits and embodied as an N-bit ripple counter. Other types of counters, such as synchronous counters may also be used in some implementations. Accumulated counts may be output over parallel digital data lines $C1_{out}, C2_{out}, \ldots CM_{out}$. In some implementations, count values from the counters can be provided to shift registers that are connected to each counter. The shift registers may also be located in the pixel and form part of the pixel integrated circuit 120. In some cases, the counters themselves are configured for additional use as shift registers. A counter's bit size can determine the most significant bit limit on signal values from a pixel.

According to some embodiments, the counters 330-1, 330-2, . . . 330-M are programmable over digital input lines $C1_{in}, C2_{in}, \ldots CM_{in}$. For example, the counters may be programmed to increment or decrement counts at the start of each exposure period. In some implementations, counting direction may be changed by a programmable control signal at any time during an exposure period. Additionally or alternatively, the counters may be programmed with an initial count value for the start of each exposure period.

Figure 3B:
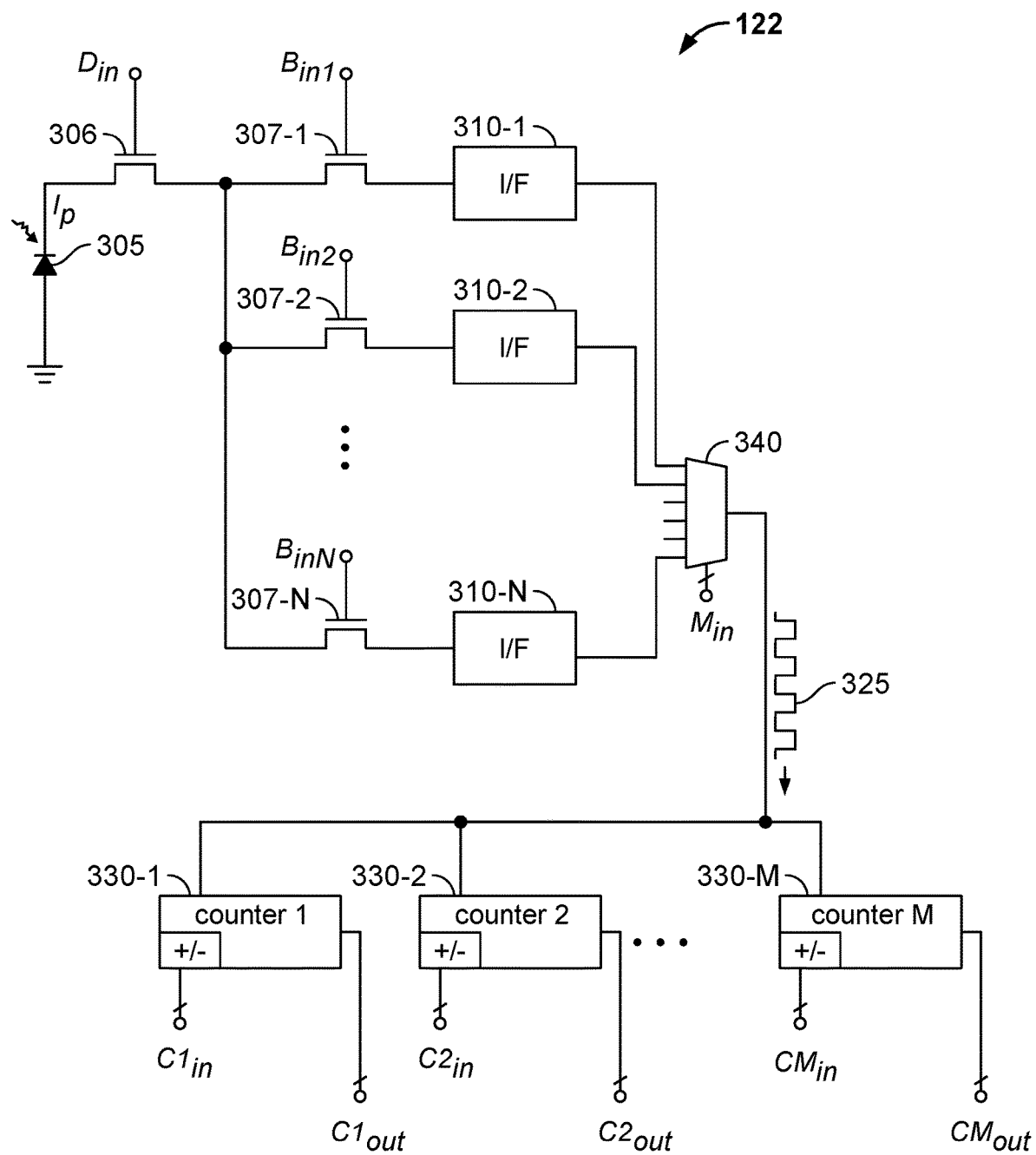
FIG. 3B depicts an example of pixel circuitry for a computational pixel imaging device, according to some embodiments.

Embodiments described herein are not limited to one current-to-frequency (or voltage-to-frequency) converter per pixel. Two or more converters may be used per pixel integrated circuit 122, as illustrated in the example of FIG. 3B. According to some embodiments, one or more pixels of a computational pixel imager can include two or more current-to-frequency converters 310-1, 310-2, . . . 310-N arranged to receive an output from the pixel's detector (photodiode 305 in the illustrated example). In some cases, there can be N second transistors 307-1, 307-2, . . . 307-N, where N is a positive integer. The N second transistors can be used to provide added isolation of the pixel's detector from resetting actions occurring in the current-to-frequency (or voltage-to-frequency) converters. Additionally, the N second transistors 307-1, 307-2, . . . 307-N can be used to select one or more of the converters 310-1, 310-2, . . . 310-N for processing of the signal from the photodiode 305. The converters can be as described above in connection with FIG. 3A, and their description need not be repeated.

According to some embodiments, outputs from the converters 310-1, 310-2, . . . 310-N may connect to a multiplexer 340 that can be controlled with a digital input signal $M_{in}$ applied to a control port. The control signal $M_{in}$ can select which input port connects to an output port of the multiplexer. In some implementations, the multiplexer 340 can be a N:1 multiplexer. FIG. 3B illustrates an example case in which the pixel's counters 330-1, 330-2, . . . 330-M can be shared by (e.g., dynamically assigned to) any of the converters 310-1, 310-2, . . . 310-N. In some cases, a multiplexer 340 may not be used for some or all converters and one or more of the converters may have separate counter(s) that are dedicated or statically assigned to each converter. Other circuit arrangements are also possible. For example, a first group of counters or a single counter in a pixel may be dedicated to one converter or shared by a first group of converters, and a second group of counters or a second single counter in a pixel may be dedicated to one converter or shared by a second group of converters.

Adding additional converters can provide redundancy in pixels and improve fabrication yields. For example, if one of the converters fails in a pixel due to microfabrication processes, another converter can be selected for the pixel so that all pixels in the array of pixel integrated circuits can be used. In some implementations, the converters 310-1, 310-2, . . . 310-N within a pixel can be configured differently (to exhibit different gain, frequency characteristics, power consumption, capacitance value for capacitor $C_0$, etc. This can provide improved coverage with the same computational pixel imager for different signal conditions and operating conditions including but not limited to gain, noise, power, and maximum detectable frequency modulations.

Adding additional converters and counters can also support multi-thread processing operations described herein. For example, a signal from a pixel's detector (e.g., photodiode 305) can be processed by one, two, or more converters and two or more counters (which may be in separate groups of counters), such that different functional operations are performed on parallel computational threads with the pixel's counters. Some of the functional operations can include bit operations such as, but not limited to, add, subtract, complement, shift, compare, and rotate.

Figure 4:
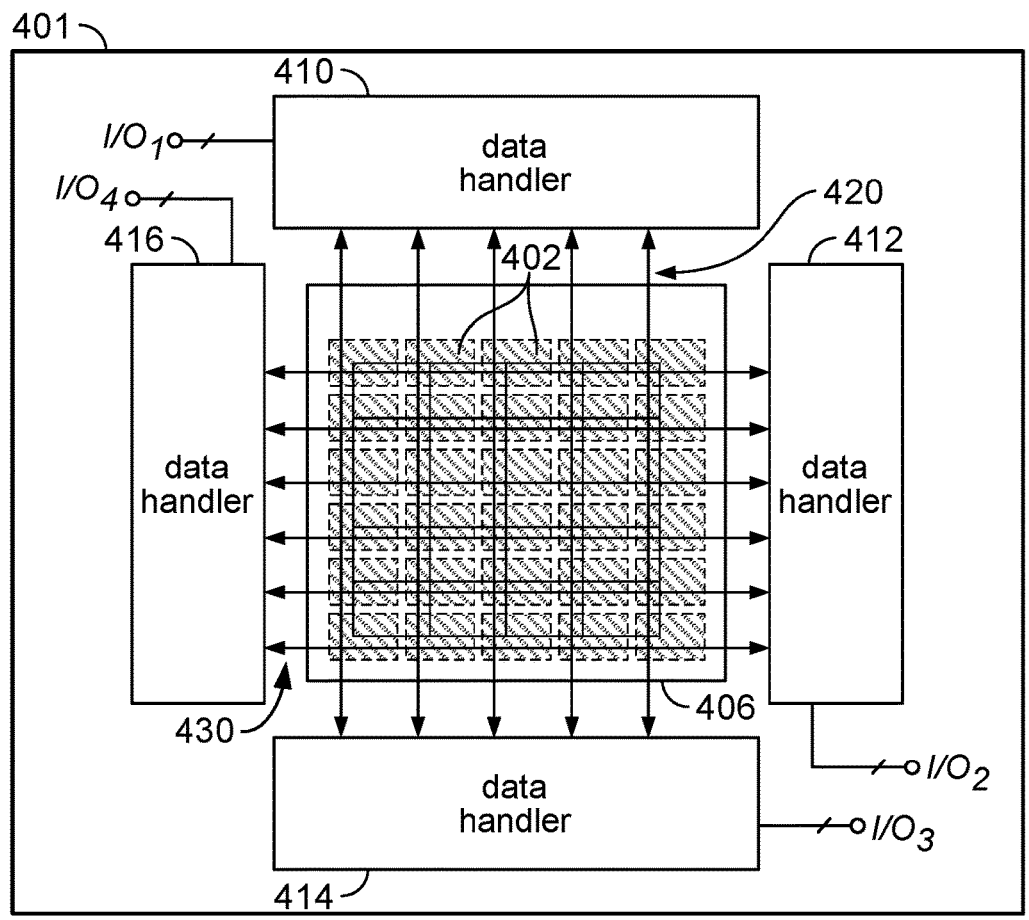
FIG. 4 depicts additional data-handling circuitry that may be used with a computational pixel imaging device, according to some embodiments.

FIG. 4 depicts some additional data-handling circuitry that can be included with a computational pixel imager. A computational pixel imager 100, 102 may include circuitry that permits the orthogonal transfer of accumulated counts on counters throughout the array 406 of pixel integrated circuits. The orthogonal transfer of count values can be accomplished by shifting count values from a pixel's counter(s) to any one of the pixel's four nearest-neighbor pixels' counters, as described further below. For illustrative purposes, each shaded rectangle 402 within the array 406 depicts approximately an area occupied by a pixel, though in an actual device there can be thousands to millions of pixels. According to some implementations, digital counts can be transferred through column-transfer data lines 420 and/or through row-transfer data lines 430 to other pixels or to the data handlers 410, 412, 414, 416. In some implementations, multiplexers can be included to serialize data from multiple column-transfer data lines 420 and/or row-transfer data lines 430 that is sent to the data handlers 410, 412, 414, 416 and/or off chip. For example, one or more M:1 multiplexers (where M can be any integer value of 2 or greater) can be used to serialize data from multiple row-transfer data lines 430 onto single data lines that provides pixel data to one or more of the data handlers.

By shifting data along rows or columns, any result or count value from a counter within the array 406 may be transferred to another counter in a different pixel within the array 406 or to the data handlers. Such transfer capability along with programmability of the counters (increment, decrement) and control of count accumulation times can allow digital signal processing operations to be performed within the array 406. Digital signal processing operations that may be performed within the array can include, but are not limited to, threshold filtering, high-pass filtering, low-pass filtering, edge-detection filtering, match filtering, spatial filtering, temporal filtering, or spatio-temporal filtering, smoothing, differentiation, data compression, time-domain integration, image correlation, and convolution.

For example, match filtering may be implemented by developing a filter kernel for cross correlation with objects in an imaged scene (e.g., a person's iris in a personal identity system, a facial image, a target object). Convolution of a kernel with an image can be implemented as a series of count accumulations (which may increment and decrement counts) and counter value orthogonal transfers. A correlated or convolved image can then be thresholded by compare logic for detections (e.g., detection of an iris or target object). Data transmitted from the array could be raw cross-correlation or convolution results, or may be only data associated with the detections alone which could reduce the amount of data transmitted and subsequently processed. In another aspect, a signal from a steering and/or motion-sensing mechanism may be used to shift accumulated counts in an array synchronously with the overall motion of an imaging system to enable time-domain integration. Similar control of shifting counts can also enable image stabilization for environments where the imaging system may undergo unwanted vibrations. In some embodiments, non-uniformity correction for an imaging array may be performed by counting down for a frame period while viewing a flat, extended source (e.g., a mechanical shutter). After the background scene is acquired, the counters can be configured to count up while the scene data is acquired. After a frame period, only signal and noise data will be present and any systematic non-uniformity of the imager will be cancelled. Non-uniformity correction may employ a 50% duty cycle for scene and background image acquisition.

In some embodiments, there may be more than one column-transfer data line 420 and more than one row-transfer data line 430 per pixel so that data from multiple counters within a pixel can be transferred in parallel to multiple counters in adjacent pixels. For example, a count value from a first counter in a first pixel can be transferred to a first counter in an adjacent pixel while a count value from a second counter in the first pixel can be transferred to a second counter in an adjacent pixel. In some cases, data serializers may be included in each pixel integrated circuit to send count values from multiple counters within the pixel serially over a signal row and/or column-transfer data line.

Data handlers 410, 412, 414, 416 may comprise additional transistor circuitry that is configured to provide additional data-processing operations and/or control of data transfer and programming of the pixel integrated circuits 120. For example, data handlers 410, 412, 414, 416 may include additional registers and data serializers to read data from and onto row and column data-transfer lines 430, 420. Data handlers 410, 412, 414, 416 may also include logic gates to enable control of the exposure period duration, counter direction, and/or threshold voltage reference $V_{ref}$. In some implementations, data handlers can be configured to perform threshold detection, compare, match filtering, and data selection functions. In some cases, data handlers can be configured to determine a read-out time for selected rows and/or columns (as may be used in connection with infinite dynamic range pixels described below, for example). Data handlers 410, 412, 414, 416 may also include input/output data lines $I/O_1$, $I/O_2$, $I/O_3$, and $I/O_4$ that can be used to send processed or unprocessed signals, for example, to an external analyzer or processor for further data processing and analysis. In some implementations, one or more of the data handlers 410, 412, 414, 416 may be located on a same chip as the array 406 of pixel integrated circuits. In other embodiments, one or more of the data handlers 410, 412, 414, 416 can be located on a different chip that is connected to the chip containing the array 406 of pixel integrated circuits. According to some embodiments, the array 406 of pixel integrated circuits and data handlers 410, 412, 414, 416 can be manufactured using complimentary metal-oxide-semiconductor (CMOS) microfabrication processes.

Figure 5A:
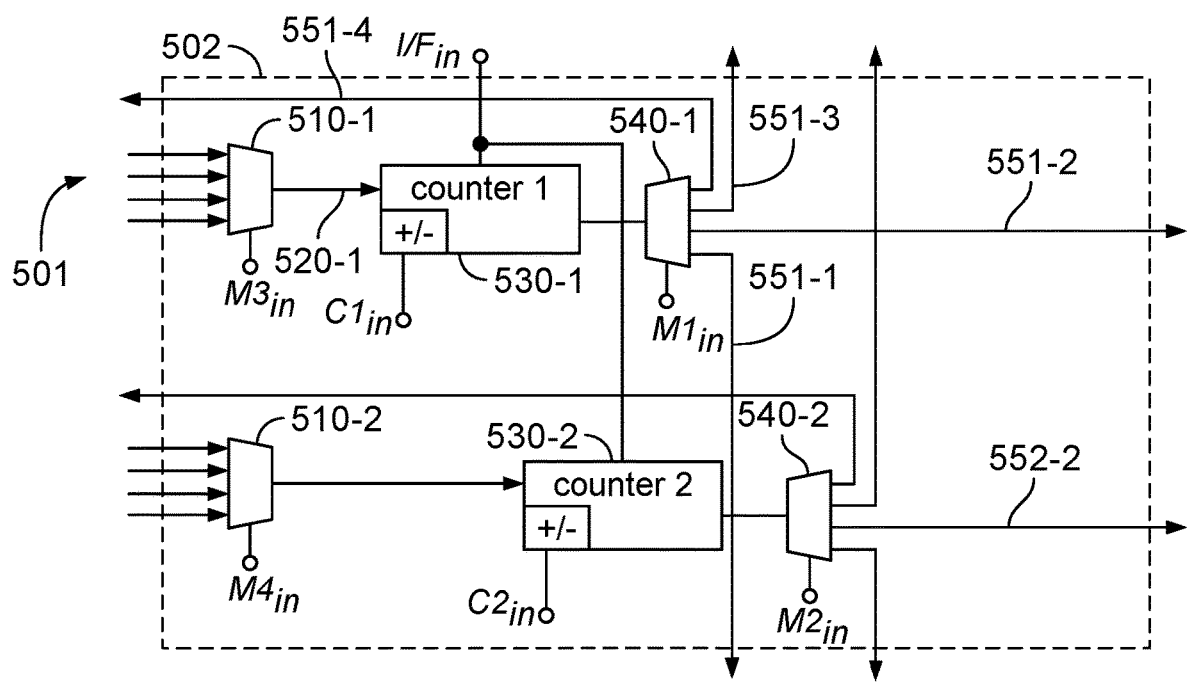
FIG. 5A depicts an example of counter connections across pixels, according to some embodiments.

FIG. 5A illustrates one example of how multiple counters 530-1, 530-2 in one pixel 502 of a computational pixel imager may be connected to counters in adjacent pixels. Although only two counters are illustrated within the pixel 502, a pixel can include more than two counters in some implementations. Additional counters can be connected in a same way to counters in adjacent pixels. In some implementations, the counters can be ripple counters, though other types of counters can be used in other embodiments. In some cases, counters may be implemented with D flip-flops for each bit and the flip-flops can be connected in series with an output of one flip-flop connected to an input of a next flip-flop. Further details of counters and associated circuitry that can be used in the implementations depicted in FIG. 5A and FIG. 5B can be found in U.S. Pat. No. 9,768,785 as described in connection with FIG. 3 and FIG. 4 in that patent, which is incorporated herein by reference in its entirety.

According to some embodiments, multiple counters are connected to neighboring counters in a way such that counters operated in a particular manner for image acquisition or performing a signal-processing function can shift count values to other counters anywhere in the array that are operated in the same manner. In some implementations, the shifting of counter values may be through nearest neighbor shifts. For example, a first counter 530-1 operated in a first manner in a first pixel 502 may shift its count value to a first counter operated in a same manner in a first nearest neighbor pixel, whereas a second counter 530-2 operated in a second manner in a first pixel 502 may shift its count value to a second counter operated in a same manner in a second nearest neighbor pixel. The first nearest neighbor pixel can be the same or different than the second nearest neighbor pixel. An example of a first manner of counter operation may be raw image acquisition where the corresponding first counters continuously count up during an exposure period. An example of a second manner of counter operation may be temporal filtering to detect changes in pixel values by modulated signals or moving objects where a count value is incremented for half an exposure period and then decremented for half an exposure period. Other manners of counter operation are possible as described above and below. By repeated nearest neighbor shifts, along rows and columns, a value on one counter can be shifted to another corresponding counter anywhere in the array.

For the example depicted in FIG. 5A, the counters can be configured to function as both counters and shift registers. Further counter values from multiple counters 530-1, 530-2 in a pixel 502 can be passed over separate data lines (e.g., row data-shift lines 551-2, 552-2) to multiple corresponding counters in an adjacent pixel. Counter values can be passed to adjacent pixels in either direction within a row or column along different data-shift lines (e.g., data-shift lines 551-1, 551-2, 551-3, 551-4). The data-shift lines may also be referred to as row or column buses. Additionally, counter values for pixels at an edge of the array can be passed to edge logic for read-out and/or data processing via the data-shift lines. The data-shift lines may be parallel data lines (such that count values are passed in parallel) or serial data lines. For serial transmission of count values, b:1 multiplexers for b-bit counters may be included in the pixel after the counter output to place count values serially onto data-shift lines. In some embodiments, shift multiplexers 540-1, 540-2 can be included in each pixel, connected to counter outputs, and controlled by signals applied to inputs $M1_{in}$, $M2_{in}$ from edge logic to direct counter values to one of the neighboring pixels. Similarly, input multiplexers 510-1, 510-2 can be connected to data inputs of the counters 530-1, 530-2 to receive and place count values from neighboring pixels' counters on counters 530-1, 530-2 within the pixel. Input multiplexers 540-1, 540-2 may also be controlled by signals applied to inputs $M3_{in}$, $M4_{in}$ from edge logic.

Figure 5B:
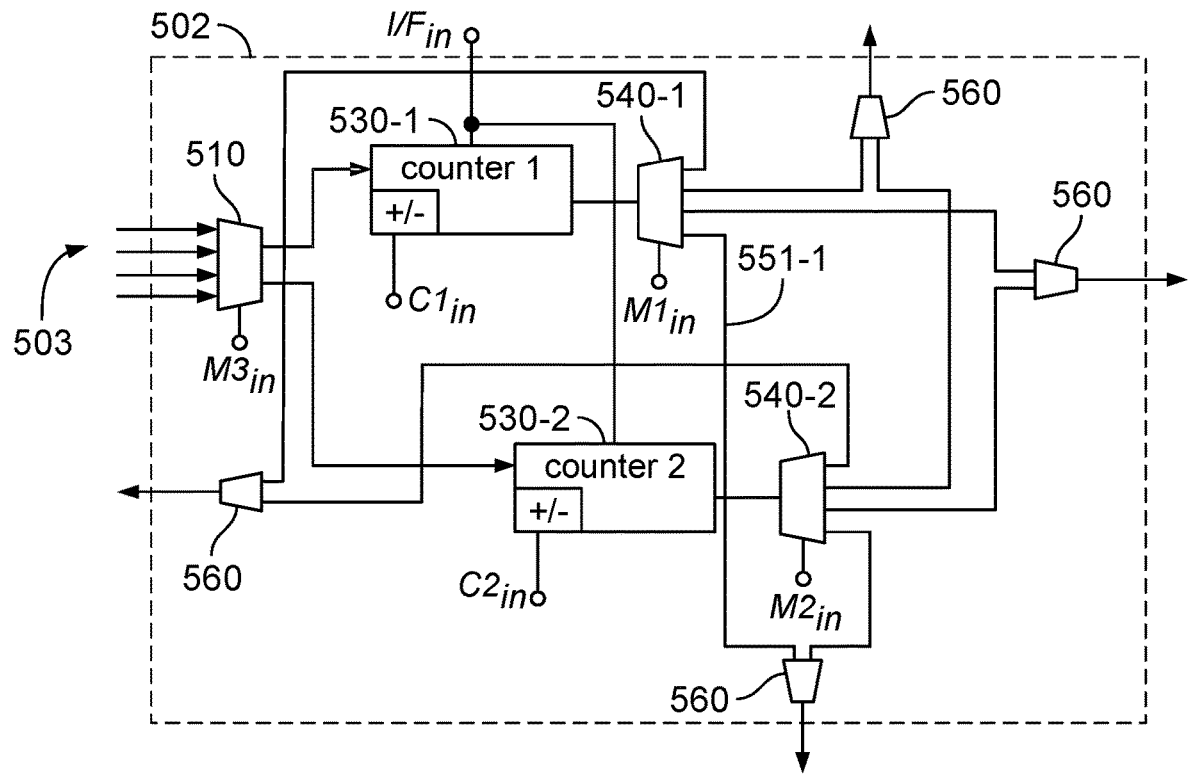
FIG. 5B depicts another example of counter connections across pixels, according to some embodiments.

Another example of inter-pixel counter connections is illustrated in FIG. 5B. In some embodiments, values from multiple counters within a pixel can be multiplexed onto a same row or column data-shift line with counter-output multiplexers 560. The counter-output multiplexers 560 can be M:1 multiplexers, where M is an integer value of 2 or greater and corresponds to the number of independently controlled counters within the pixels. Additionally, data received from adjacent pixels can be received by a single input multiplexer 510. The input multiplexer 510 can be a 4:M multiplexer, where M is an integer value of 2 or greater and corresponds to the number of independently controlled counters within the pixels.

Figure 6:
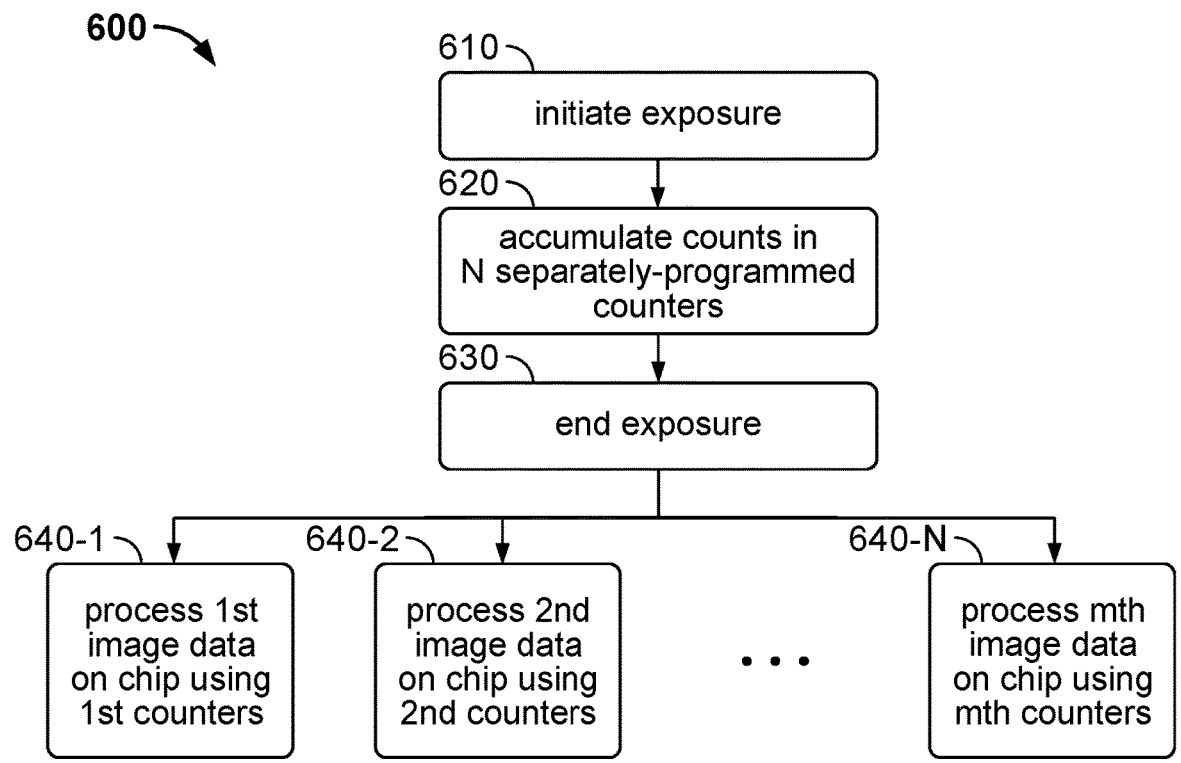
FIG. 6 illustrates acts associated with multi-thread processing of image data acquired by multiple counters, according to some embodiments.

FIG. 6 illustrates an example method of multi-thread processing 600 that can be performed with an array 406 of pixel integrated circuits having multiple programmable counters in each pixel and arranged to shift values to counters in adjacent pixels as described above. According to some embodiments, a method 600 can include acts of initiating (act 610) an exposure of a detector array of a computational pixel imager to generate image data. During an exposure period (e.g., a signal acquisition period that can be used to form an image frame), multiple counters in each of a plurality of pixels can accumulate (act 620) count values. The count values for at least some of the counters can be accumulated independently of count values accumulated by other counters and can differ from count values accumulated by other counters, even within a same pixel. In some implementations, the counters within a same pixel can be programmed to operate differently. For example, two counters within a pixel may be programmed to increment and decrement counts periodically at a same frequency but with phases shifted by 90 for in-phase and quadrature (I-Q) detection of a modulated optical signal whereas a third counter can be programmed to increment counts for one-half of an exposure period and to decrement counts for one-half of an exposure period to detect non-stationary objects in an imaged scene. Accumulation of counts in counters can terminate when and exposure is terminated (act 630) ending the exposure period. In some cases, one or more counters within a pixel can be programmed to accumulate counts in response to exposure of the pixel's detector, whereas one or more other counters within the pixel can be programmed to perform other operations on data previously accumulated or provided to the counter(s) (e.g., shift operations, bit rotation operations, ones complement, addition, subtraction, compare, read-out, data receive, etc.) Such different in-pixel operations on the counters can be in response to multiple threads that execute simultaneously on the system.

After counts have been accumulated in multiple counters, two or more independent data-processing operations can be executed on multiple threads simultaneously with the pixel integrated circuit array. For example, first image data (first counter values) acquired with first counters from the pixels can be processed (act 640-1) using shift operations and/or any of the above counter operations to perform a first signal-processing function (e.g., spatial filtering). Additionally, second image data (second counter values) acquired with second counters from the pixels can be processed (act 640-2) using shift operations and/or any of the above counter operations to perform a second signal-processing function (e.g., temporal filtering). In some implementations, the different signal-processing functions can be performed, at least in part, while count values are being accumulated in a subsequent exposure period (as may be the case for convolution, correlation, time domain integration for a deterministically moving camera, or image stabilization functions). In some cases, raw count values may be accumulated as new image data on one or more counters in a pixel while signal processing operations are being performed with other counters, such that the computational pixel imager has essentially no dead time in imaging a scene or successive scenes.

As indicated in FIG. 6, the multiple execution threads (acts 640-1, 640-2, . . . 640-N) can execute simultaneously. For imaging systems in which outputs and inputs of multiple counters are connected across pixels with separate, parallel data-shift lines (e.g., lines 551-2, 552-2) as illustrated in FIG. 5A, at least some signal-processing operations for different counters performing different functions can occur at a same time (e.g., on same clock cycles that drive data transfer or arithmetic operations). For imaging systems in which outputs and inputs of multiple counters are connected across pixels using multiplexers to serialize counter data onto shared data-shift lines as illustrated in FIG. 5B, at least some signal-processing operations for different counters performing different functions may be interleaved in time and occur on alternating clock cycles. In either case, multiple execution threads (acts 640-1, 640-2, . . . 640-N) can execute concurrently on a pixel integrated circuit chip.

When one or more of the multiple execution threads are completed, data for the corresponding counters can be read out of the array 406 of pixel integrated circuits over column-transfer data lines 420 and/or row-transfer data lines 430 for display, analysis, storage, and/or further signal processing.

In some embodiments, a computational pixel imaging device 100 of the above-described embodiments can include counters that are configured for infinite dynamic range sensing. The dynamic range of an image sensor describes the difference between the brightest and dimmest object that can be detected and discerned in an image. Conventional digital imaging approaches typically cannot achieve high dynamic ranges over three or four orders of magnitude, for example. Digitizing in-pixel, as is done for a computational pixel imaging device 100, can improve the dynamic range capability over conventional digital imaging sensors. However, digitizing in the pixel for high dynamic ranges presents challenges when trying to implement with small pixel sizes. To achieve a high dynamic range, the size of counters must be increased. An advanced CMOS process node may be used to reduce transistor and counter size, but such advanced microfabrication processes may be prohibitively expensive in some instances. Other approaches to reducing the size of digital-pixels (e.g., to the 10 μm size or smaller) is desirable to reduce the size, weight, and power (SWaP) of imaging sensors and imaging devices. The inventors have recognized and appreciated the finite-bit counters (e.g., an 8-bit counter) can be configured for unlimited dynamic range.

Figure 7A:
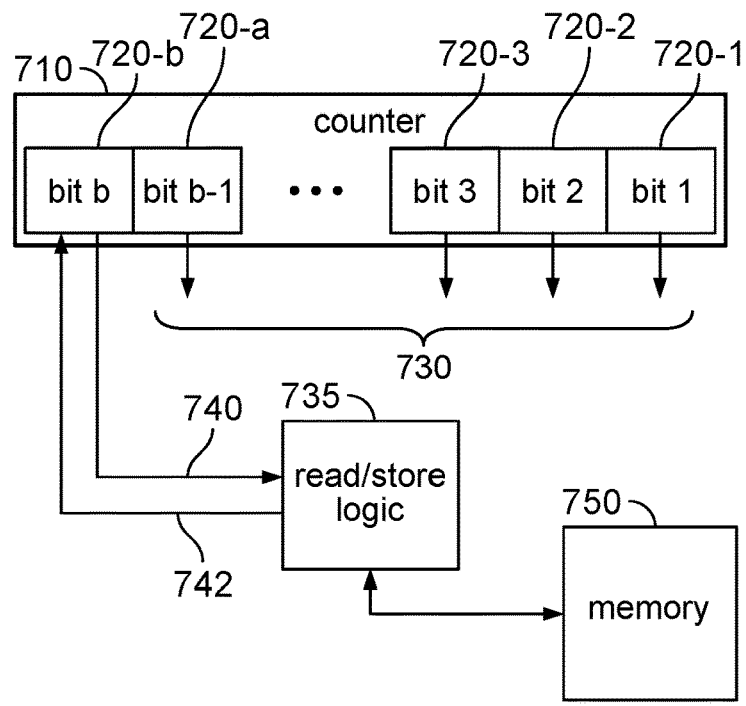
FIG. 7A depicts example circuitry for infinite dynamic range sensing in a pixel, according to some embodiments.

An example of circuitry for an infinite dynamic range counter 710 is depicted in FIG. 7A, according to some embodiments. As depicted in the drawing, circuitry for an infinite dynamic range counter 710 can include a b-bit counter, read/store logic 735 that is in communication with the counter, and memory 750. The counter 710 can comprise any type of counter described above, such as a ripple counter or synchronous counter or other types of counters. The read/store logic 735 may be embodied as processing logic that could be located on-chip or off-chip and that is configured to determine when to read the most significant bit or group of most significant bits of one or more counters of a computational pixel imaging device 100 and store in memory 750 information indicating that counters have rolled-over in count value one or more times. In some cases, read/store logic 735 can be implemented as on-chip logic gates or field-programmable gate arrays located within each pixel, or located at an edge of an array 406 of pixel integrated circuits (e.g., in one or more of data handlers 410, 412, 414, 416 referring to FIG. 4).

According to some embodiments, an infinite dynamic range counter 710 can comprise a b-bit counter in which the most significant bit (MSB) 720-$b$ is interrogated differently than the lower bits 720-1, 720-2, . . . 720-$a$. The size of the counter (value of b) can be any integer value of 2 or greater. In some implementations, the size of the counter is between 3 bits and 25 bits, though larger counters may be used in some cases. In various embodiments, the MSB 720-$b$ is interrogated at a higher read-out rate than the lower bits. For long exposure periods and/or high signal levels, counters in some pixels can reach their maximum count value and roll-over to a value of 0 and continue counting up. If the roll-over is undetected, signal information is lost. By reading out the MSB or group of MSBs value(s) at a higher rate than the lower bits, roll-over events can be detected and recorded, so that subsequent image data read out for all bits of counters can be corrected to reflect accurate signal levels. A group of MSBs may be a counter's MSB and the next N lower bits (e.g., bits b, b-1, b-2, . . . b-N) where N is a positive, non-zero integer.

Figure 7B:
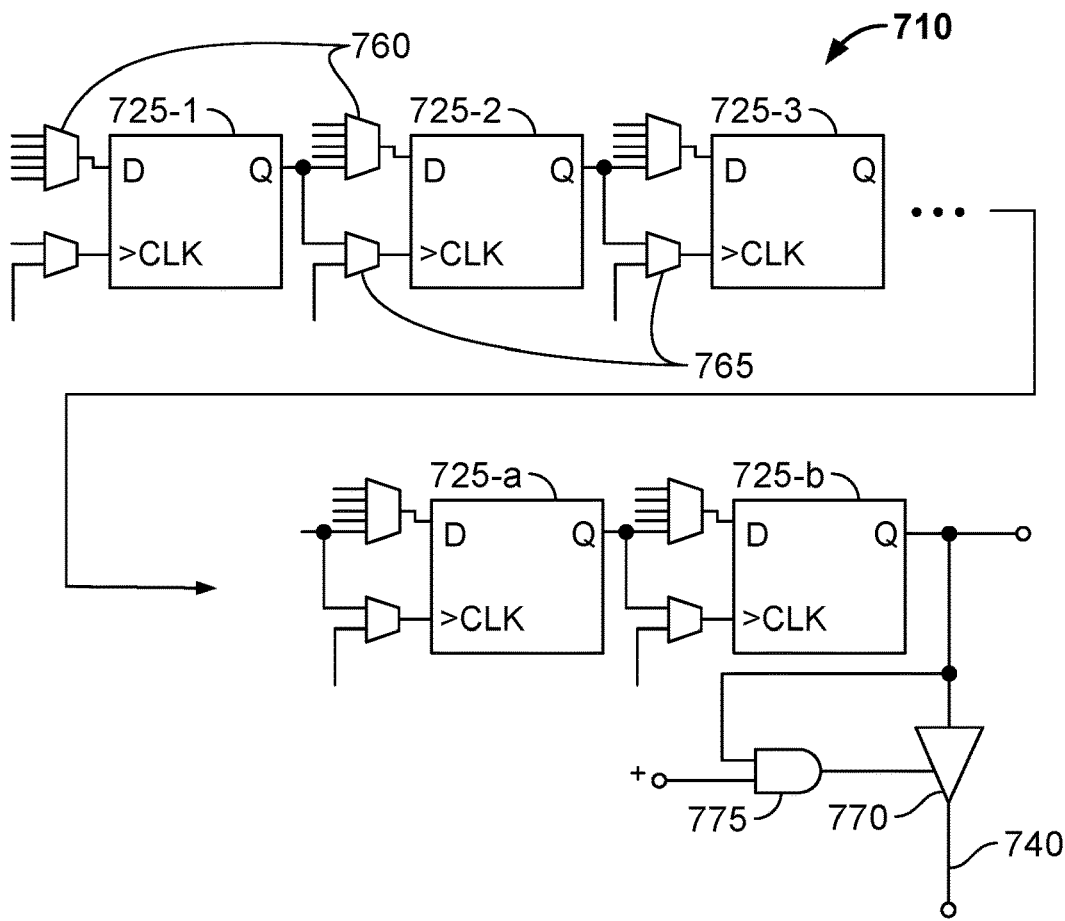
FIG. 7B illustrates further details of an embodiment of circuitry for infinite dynamic range sensing in a pixel.

In some implementations, outputs from counters can be connected in parallel across corresponding counters in an array 406 of pixel integrated circuits, as described above in connection with FIG. 5A or FIG. 5B. In some cases, bit values for counters may be connected in parallel across corresponding counters in an array 406. For example, the data-shift lines may comprise parallel data lines 730, 740 with the number of parallel data lines equaling the number of counter bits. Additional multiplexers may be used for each of the parallel data lines. As such, a MSB from each counter in a row or column may be connected to a same data-shift line. In some cases, values of MSBs can be read from shared data-shift lines using a synchronous cadence read-out, for example. In other embodiments, the counter may be configured to pass bits between each counter unit that is used to record a bit, as depicted in FIG. 7B, for example, for as described in U.S. Pat. No. 9,768,785. In such cases, bit values for counters may not be connected in parallel across corresponding counters in an array 406. Instead, bit values may be shifted sequentially onto a same data-shift line.

In operation and according to some embodiments, an infinite dynamic range counter can work as follows. While counters accumulate count values during an exposure period, the values (logic levels) of the counters' MSBs (or groups of MSBs) can be read and monitored by read/store logic 735 over MSB data lines 740. In some implementations, when a counter's MSB toggles to a logic 1 state (or group of MSBs toggle to a predetermined value), the value may be signaled to and/or detected by read/store logic 730 by placing the value on one or more data lines (e.g., placing a MSB's value on data line 740). In some cases, a bit's value may be placed on a data line 740 by in-pixel logic, such as an AND gate, for example. In some cases, all MSB bit values (or groups of MSBs values) for all counters in the array 406 may then be destructively read out so that the MSB values that have toggled to 1 (or a predetermined value) are read and reset to 0. A toggling of the MSB (or group of MSBs) can indicate a roll-over of the b-1 bits (or b-N-1) and an upcoming roll-over for the b-bit counter. A record of a counter's toggling or roll-over and address can be stored in memory 750 by the read/store logic 735. The address can be determined from the read address used to access the counter when all counters in the array are read or all counters in a row or column are read. In some cases, the address may be determined based upon clock cycles used to read counters in a row and/or column. Read/store logic 735 may reset counters' MSB value(s) over control lines (e.g., control line 742). The counters are then allowed to continue accumulating count values until a next MSB or group of MSBs toggles. The number of togglings or roll-overs for each counter can be accumulated in memory 750, where each toggling represents a count of $2^{(b-1)}$ (or $2^{(b-N-1)}$). For count down operation, roll-over events may be detected by detecting a logic 0 level, or by inverting the MSB output and detecting a logic 1 level.

In some embodiments, in-pixel logic or edge logic may be configured to detect, for example, a falling edge or negative edge of the $b^{th}$ bit. For example, a monitor flip-flop may be configured to latch a logic 1 value to its output when the MSB value rolls over from 1 to 0. Additional in-pixel logic may assert output of the monitor flip-flop on a data line that can be detected and read. The monitor flip-flop can then be reset to detect a next falling edge of the MSB. In such embodiments, each detected logic 1 level from the monitor flip-flop indicates $2^b$ counts and the MSB does not need to be reset.

In some embodiments, instead of reading the entire array of counters after detecting a logic 1 on an MSB data line 740, only MSB values of counters (or monitor flip-flop outputs) in a row and/or column containing the counter that has toggled may be destructively read. Such a strategy may reduce read-out times and avoid reading of counters that have not yet had an MSB toggle. In yet other embodiments, time-gated row and column monitoring may be performed by read/store logic to detect and determine the location and address in the array 406 of a counter whose MSB value has toggled, and only that counter (or monitor flip-flop) will be destructively read.

In alternative embodiments, read-out times of counters' MSB values may be predicted based on prior count accumulations. For example, a first exposure over a first time period may be performed for a short duration in which none of the counters' MSB values roll over. First count values can accumulate on the counters during this exposure period. In some cases, times for reading and resetting MSB values from one or more counters may be determined from the $(b-1)^{th}$ bit value (or other bit's value) of a relevant counter in the array. For example, when the $(b-1)^{th}$ bit value (or other bit value) of a first counter in the array toggles to a logic 1 level and the duration of the exposure period is known, a count rate for the counter can be determined. The count rate can be used to predict, on a subsequent longer exposure, when the counter's MSB value will toggle to a logic 1 level, e.g., and must be read (e.g., accumulate a roll-over count in memory 750) and/or reset. Accordingly, the count rates for all counters in an array 406 can be determined and used to predict when one or more counter's in the array will roll over. The information can then be used to determine, for longer exposures of a same scene, when to read the MSBs of the counters, either globally (reading all counters' MSBs sequentially in a read-out) or individually.

In some embodiments, the duration of the first exposure may be estimated based on prior images, or several exposure periods may be tried and linearity of increasing counts between at least two successive exposures checked to determine whether any of the counters have rolled over. If all counters have increased linearly or nearly-linearly in two successive exposures, then either exposure results may be used to estimate when roll-overs could occur.

In some implementations, a first exposure's duration may be determined and terminated automatically. For example, a counter's MSB value may be asserted on a row or column data-shift line as soon as the MSB toggles to a logic 1 level. The value may be asserted by in-pixel logic. Edge logic may detect the logic level and terminate the exposure period. Read/store logic 730 may then read-out all counters and process their count values to determine count-accumulation rates for each counter. The count-accumulation rates can then be used to determine when to read MSB values from one or more counters during a subsequent longer exposure period of a scene during which at least some counters' values would roll over.

In yet further embodiments of an infinite dynamic range counter, each counter may be divided equally or unequally into two bit groupings and each grouping may be used to accumulate counts. In such embodiments, the bit groupings may be read at different times and total counts accumulated in memory located outside the array of pixels. For example, a first of the two bit groupings (e.g., bit 1 to bit (b-N-1)) can be read and reset at a first time, and subsequently the second of the bit groupings (bit b-N to bit b) can be read and reset a second time, and the process repeated multiple times during an exposure period for an image. In some cases, the reading and resetting may alternate between the two bit groups for each successive read. In other cases, the read and reset rates may differ for the two groups. The read and reset rate for a bit group may be determined by any of the above-described methods for an infinite dynamic range counter.

For computational pixel imagers that employ infinite dynamic range counting, additional operations may be executed on count accumulations that have been recorded in memory 750. For example, when on-chip data processing or data-shift operations occur (such as for filtering), then such operations can be mirrored or complied with using the count accumulation data in memory. For example, if counter values are shifted in the array 406 of a computational pixel imager, then addresses associated with off-array count accumulations may be updated to reflect the on-array shift of counter data.

Further details of example circuitry for a counter configured for infinite dynamic range operation are illustrated in FIG. 7B. In some implementations, a b-bit counter 710 may be configured as series-connected D or JK flip-flops 725-1, 725-2, . . . 725-a, 725-b with reconfigurable data inputs D and reconfigurable clock inputs CLK. Each flip-flop can be used to store one bit. For count accumulation corresponding to a received signal, the flip-flop clock inputs can be reconfigured on-the-fly, so that the series of flip-flops operates as a ripple counter. For example, pulses 325 from the current-to-frequency converter 310 (referring to FIG. 3A) can be applied to the clock input of the first flip-flop 725-1 (least significant bit) and used to toggle the output of that flip-flop. The output of each flip-flop may then drive the clock of the next flip-flop to form a ripple counter. For read-out, the clocks of each flip-flop may be connected to a same read-out clock and the data inputs D connected to the data outputs Q of the preceding flip-flop, so that data can be shifted across and out of the counter 710.

For any of the above-described embodiments of counters, a tri-state buffer 770 may be used to place the output value Q of the flip-flop 725-b corresponding to the MSB on a data line 740, as illustrated in FIG. 7B. In some cases, additional tri-state buffers may be used for other flip-flops. For configurations where a counter is adapted for infinite dynamic range counting and wherein a toggling of the MSB to a logic 1 level can be automatically sensed, an AND gate 775 (or analogous logic circuitry) can be used to monitor the output of the MSB flip-flop 725-b and activate the tri-state buffer 770 when the MSB toggles to a logic 1 level. An advantage of using the tri-state buffer 770 is that a flip-flop's output Q can be isolated from the data line when the output Q is at a logic 0 level. In some implementations, the data line 740 may be a separate and dedicated data line for monitoring only the value of the MSB (e.g., separate from a data line that is used to read out the entire counter value or to provide orthogonal shifting of counter values in the array 406). In other implementations, the data line 740 may be a same data line that is used to read out the entire counter value or to provide orthogonal shifting of counter values.

Counters configured for infinite dynamic range counting may be included in computational pixel imagers having multiple counters in each pixel as described above (e.g., for multi-thread signal processing). Counters configured for infinite dynamic range counting may also be included in computational pixel imagers configured for down-sampling of modulated signals, as described below in connection with FIG. 9.

Figure 8:
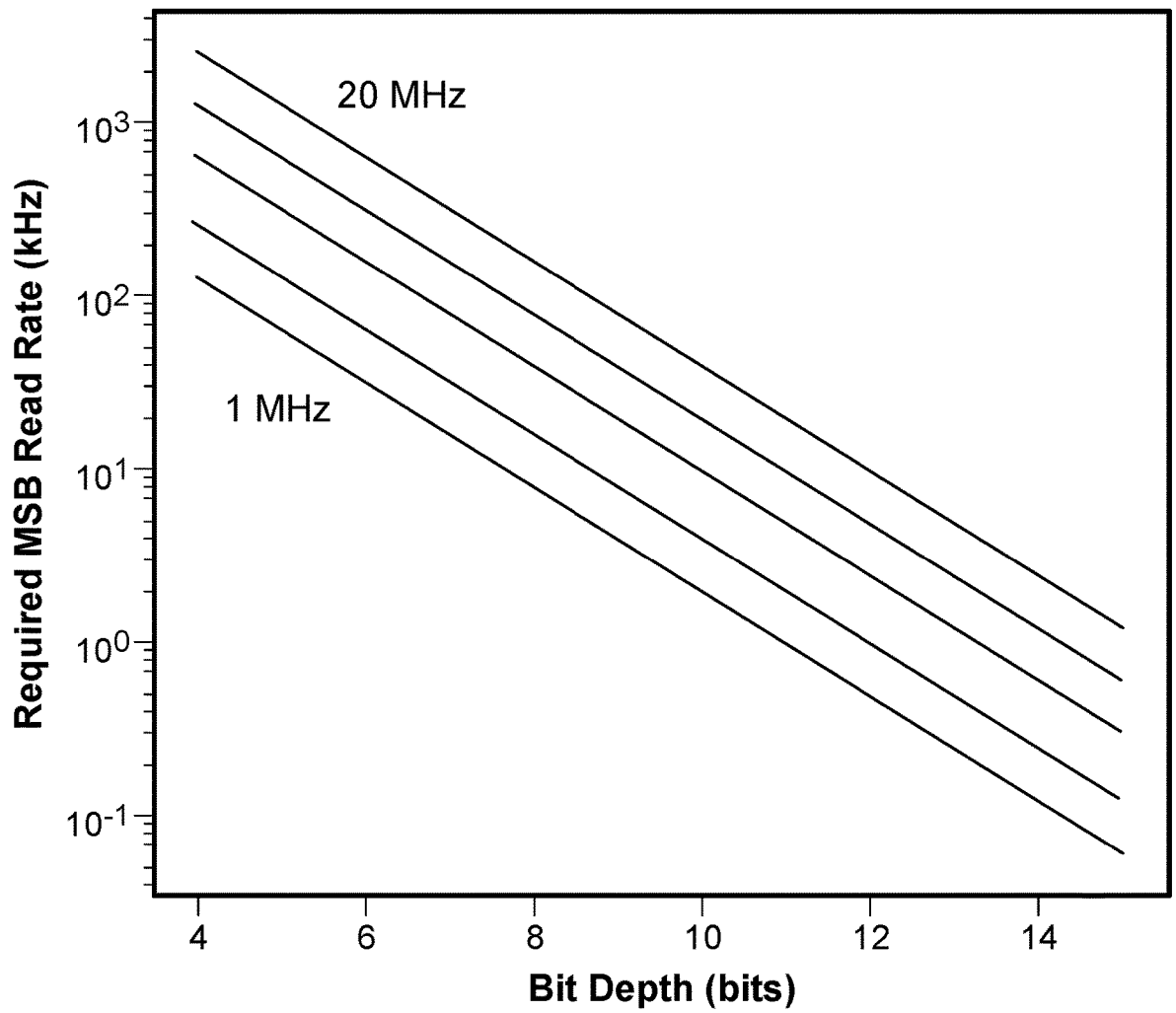
FIG. 8 plots examples of most significant bit read rates for counters adapted for infinite dynamic range sensing in a pixel, according to some embodiments.

Example read-out rates for MSB values are plotted in FIG. 8 for various count accumulations rates from 1 MHz to 20 MHz and counter bit depths. The plotted MSB read-out rates correspond to rates required to avoid missing a roll-over event. The lines of count accumulations rates are, from top to bottom, 20 MHz, 10 MHz, 5 MHz, 2 MHz, and 1 MHz.

By monitoring, reading out MSB values of counters, and recording roll-over events in memory 750, long exposure durations can be performed and/or scenes with high intensity sources can be viewed and captured with high dynamic range. Counters may roll over multiple times during a high-dynamic range exposure period, and the number of roll-over events for a counter accumulated in memory 750. The number of roll-over events stored in memory 750 are in quanta of $2^{(b-1)}$ counts. At the end of a high-dynamic range exposure period, the number of counts for a counter indicated in memory 750 are combined with the final count value for the counter to obtain the total number of counts. By using the above approach for predicted read rates, the inventors have shown in simulations that total counts in excess of $10^6$ can be accurately recorded for an 8-bit counter used in a pixel. The count accumulation rate was 10 MHz and the MSB read-out rate was 80 kHz. In this way, the dynamic range of a sensor can be increased to essentially any value, which is limited by the exposure duration or size of off-array memory 750. Memory 750 may be off chip in some cases or on-chip in circuitry located around an edge of the array 406.

Additional aspects are possible with a computational pixel imaging device 100. For example, pixel integrated circuits 120 (which can include multiple counters as describe above and/or infinite dynamic range counter circuitry) can be configured for digital pixel down-sampling in some implementations. For some applications, it can be desirable to detect the frequency or measure the phase of an intensity-modulated light source that is present in a scene or used to illuminate objects in a scene viewed by a computational pixel imaging device 100. For example, the phase of amplitude-modulated light returned from an object can contain information regarding the distance of the object from the observer. In-pixel digitization with two counters may be used to determine phase of amplitude-modulated light. For example, the two counters can be controlled to cyclically count up and down at a same frequency as the modulated source, but one counter's phase is shifted by 90° with respect to the other counter (e.g., in-phase and quadrature detection). A limitation of using amplitude-modulated light to measure distance is that relatively high modulation frequencies (e.g., MHz to GHz frequencies) may be needed to achieve high distance resolution. The use of high modulation frequencies can challenge the ability of current-generation, up/down counting, digital-pixel electronics. In addition, the power requirements for detecting high-frequency modulations can be unacceptably high for some embodiments. The inventors have recognized and appreciated that apparatus and methods can be employed to adapt sensors of computational pixel imaging devices to down-sample the modulated signals so that relatively low frequency up/down counters can be used to detect phases of modulated signals at much higher frequencies.

Figure 9:
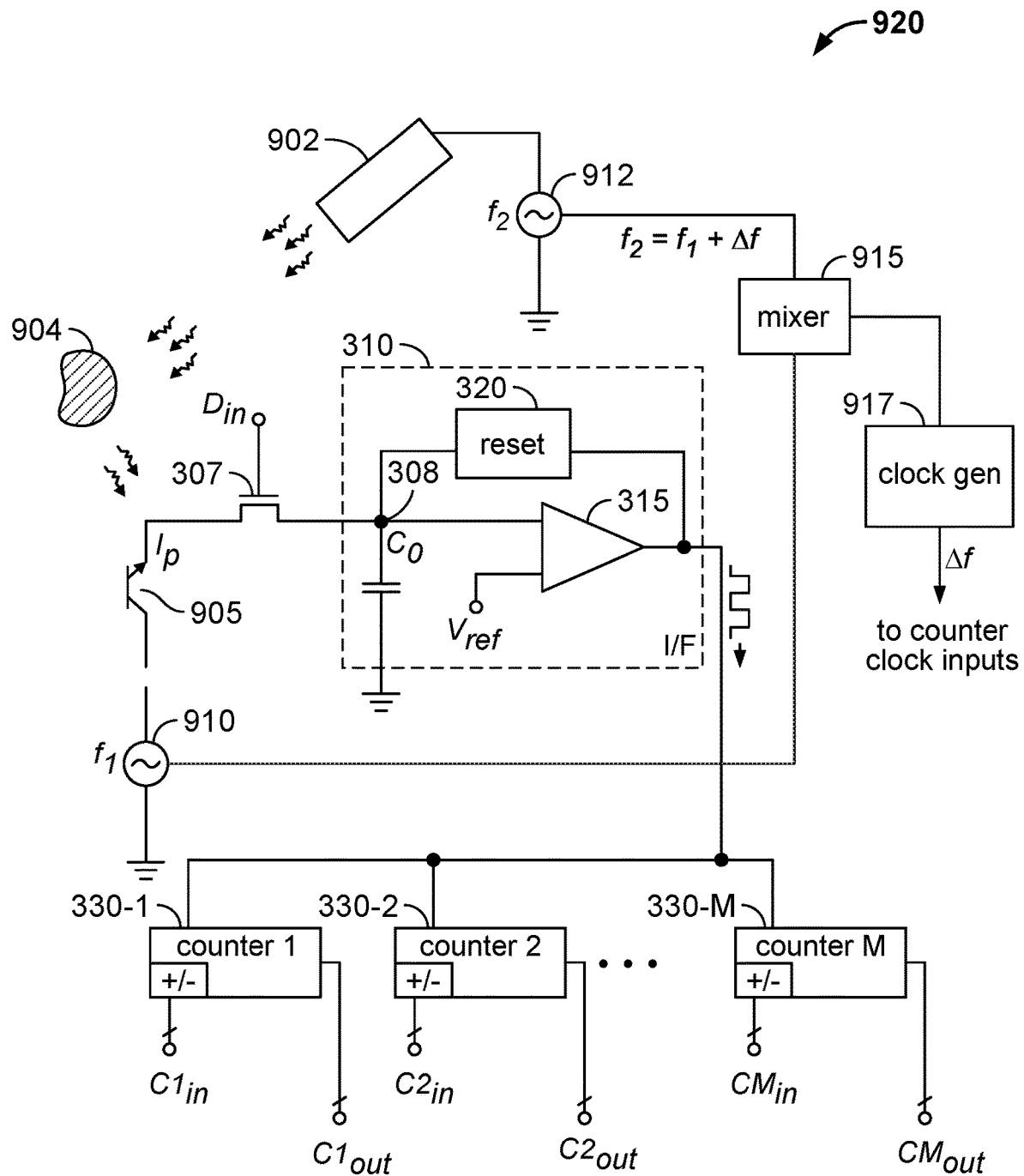
FIG. 9 depicts an example of a pixel integrated circuitry that is adapted for digital down sampling, according to some embodiments.

FIG. 9 illustrates an example of a pixel integrated circuit 920 adapted for digital down-sampling. The pixel integrated circuit may be used in pixels of a computational pixel imager and contain the same components as for the pixel integrated circuit 120 described above in connection with FIG. 3A, which will not be described again and are given same reference numbers. In some embodiments, a detector 905 of a computational pixel imager may be adapted to be biased with a modulated supply 910 that can provide, for example, a modulated bias or supply voltage to the detector. The modulated supply 910 may be located off-chip and provided to one or more pixels' detectors via bias lines. The detector 905 may be a p-n junction photodiode in some embodiments or may be a phototransistor, as illustrated in the drawing.

For digital down-sampling, the modulation of the supply 910 can be at a first frequency $f_1$ that differs from a second modulation frequency $f_2 = f_1 + \Delta f$ that is used to modulate the amplitude of a light source 902 that illuminates an object 904. The object 904 can be in a field of view that is imaged onto an array of detectors in a computations pixel imager. In some implementations, the light source 902 may comprise a laser, one or more laser diodes, one or more light-emitting diodes, etc. that is (are) driven by a second modulated supply 912. Modulated light can be returned (scattered or reflected) from the object 904 and detected by the modulated detector 905.

According to some implementations, one or both of the modulated supplies 910, 912 can be included with either or both of an array of pixel integrated circuits 120 or an array of detectors 110. In some implementations, one or both of the modulated supplies 910, 912 can be included in a computational pixel imaging system. In some cases, a computational pixel imaging system may be provided without the supplies 910, 920, but may have modulation inputs configured to receive one or both of the modulation signals from modulated supplies 910, 920.

In some embodiments, one of the frequencies $f_1$ or $f_2$ may be derived from the other (e.g., by using a mixer that mixes $f_1$ with a signal from a source operating at the difference frequency $\Delta f$). In such embodiments, a computational pixel imager may include one or both of the difference-frequency source and high-frequency source. Further, an output from the difference-frequency source can be used to drive count-up and count-down cycles of one or more counters instead of an output from a mixer.

The difference ($\Delta f$) between the two modulation frequencies $f_1$, $f_2$ can be significantly smaller than the value of either frequency. For example, the difference can be tens or hundreds of kilohertz (e.g., between 10 kHz and 500 kHz) whereas the modulation frequencies can be in the megahertz to multi-gigahertz range. Modulation of the bias on the detector can change the sensitivity of the detector and/or effectively gate the detector on and off. The detector 910 can then act as a mixer and demodulate the received modulated optical signal so that the counters 330-1, 330-2, . . . 330-M can detect at the difference frequency $\Delta f$. Using this technique, no loss of information from the modulated light source 902 will occur, and high-resolution distance determination and depth imagery can be achieved with low-frequency counters in pixel integrated circuits. For example, digital up-down counting during an exposure period can be performed at the difference frequency for in-phase/in-quadrature phase determination as described above. In some cases, the first and second frequencies $f_1$, $f_2$ can be provided to a mixer 915 (which may be included with a computational pixel imaging system). An output from the mixer can be used to generate a clock signal with clock generation circuitry 917. The generated clock signal may determine the periodicity of count-up and count-down cycles of one or more of the counters 330-1, 330-2, . . . 330-M. A benefit to this technique is that pixel and device power can remain low while still measuring the return phase of a reflected signal.

In some implementations, an optical element (lens, diffractive optical element, etc.) can be placed in front of the optical source 902 to project a pattern of light onto the object. The pattern may be, for example, an array of spots or lines. Distortion of the pattern and/or distances to each portion of the pattern can be detected with a computational pixel imager, even though returned light from the pattern may be dim or not visible to the naked eye due to other illumination of a field of view. Analysis of the pattern distortion can be used to determine three-dimensional geometry of the object as well as one or more distances to the object.

The inventors have recognized and appreciated that a computational pixel imaging device, for example, the computational pixel imaging device 100 of the above-described embodiments can be adapted for event-based imaging. Instead of or in addition to capturing and digitizing intensity data, a pixel integrated circuit can be configured to detect changes in received light intensity and return a null signal or not report a signal when no changes are detected. A meaningful change in detected light intensity (e.g., a change greater than a predetermined amount or threshold value) may be referred to as an "event." Such changes may be of interest in certain imaging applications (e.g., to emphasize detection of moving objects in an imaged scene). Unlike conventional event-based vision devices, a computational pixel imaging device adapted for event-based imaging can provide event images, each of which may include data about multiple events detected by pixels in an array during an image acquisition period, which may include an exposure period as described above. An image acquisition period for a computational pixel imager may comprise time associated with signal acquisition (e.g., during an exposure period) and time associated with on-chip signal processing to prepare image data for read out. The data associated with each event in an event image may indicate the address of the pixel that detected the event and/or the magnitude of the change detected by the pixel. Additionally, only data associated with pixels that have detected an event may be transmitted for further processing rather than an entire frame of data containing information from every pixel in an imaging array. An event-based computational pixel imaging device that transmits sparse pixel data, at least part of the time, can reduce latency and power, and improve data rate and dynamic range over conventional event-based vision devices.

Figure 10:
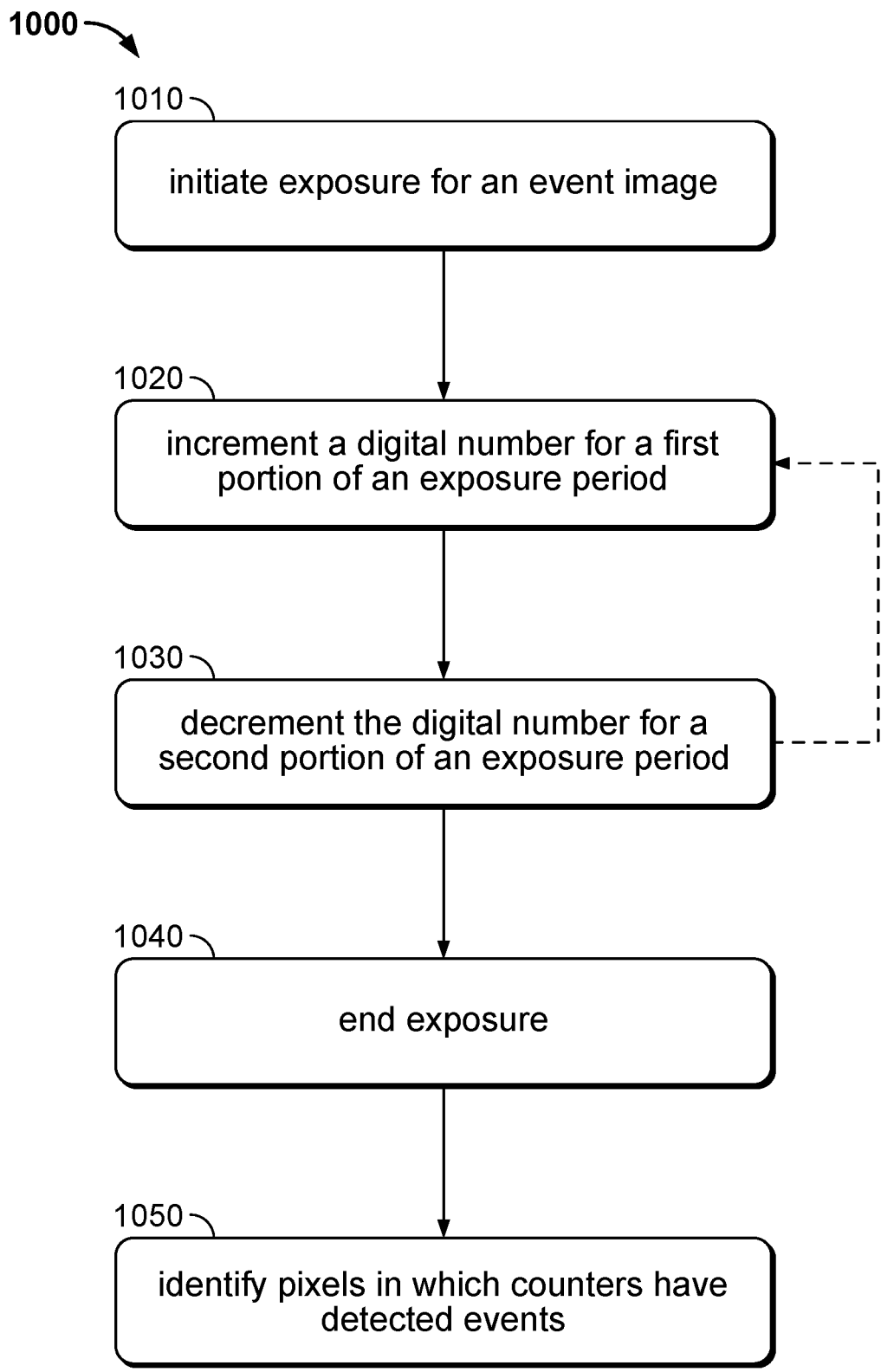
FIG. 10 illustrates acts associated with event-based imaging, according to some embodiments.

FIG. 10 illustrates an example method 1000 of event-based imaging that can be performed with an event-based computational pixel integrated circuit, according to some embodiments. An event-based computational pixel integrated circuit may be configured similarly to the pixel integrated circuit 120 as described above with respect to FIG. 3A. The event-based computational pixel integrated circuit may include the first transistor 306 or input transistors 306, 307 and the current-to-frequency converter 310 that includes the capacitor $C_0$. The event-based computational pixel integrated circuit may further include at least one digital counter configured for event-based imaging. Like the counters 330-1, 330-2, . . . 330-M illustrated in FIG. 3A, at least one digital counter configured for event-based imaging may be arranged to receive as input the pluses 325 from the current-to-frequency converter 310. Different from the counters 330-1, 330-2, . . . 330-M, at least one digital counter configured for event-based imaging may provide an output by performing at least a portion of the acts of the method 1000.

In some embodiments, at least one digital counter configured for event-based imaging may be capable of operating in multiple modes including, for example, a normal imaging mode and an event-based imaging mode. The mode that the counter operates in may be triggered by a control signal from, for example, the controller 250 and/or the data handlers 410, 412, 414, 416. In the normal imaging mode, the counter may count in a single direction, for example, either incrementing counts or decrementing counts, during an exposure period like the counters 330-1, 330-2, . . . 330-M such that a digital number output by the counter indicates the intensity of radiation captured by a detector coupled to the counter (e.g., a photodiode 305). In the event-based imaging mode, the counter may count in two opposite directions during an exposure period by, for example, performing at least a portion of the acts of the method 1000 as described below, such that a digital number output by the counter indicates whether an event has been detected by the detector coupled to the counter. Additionally, the resulting count can also indicate the magnitude of the detected event.

According to some embodiments, the method 1000 may include acts of initiating (act 1010) an exposure of a detector array of an event-based computational pixel imager to generate an event image. During a first portion of the exposure period (e.g., for a time duration t less than an exposure period), in each pixel of a plurality of pixels in the array, the counter configured for event-based imaging may accumulate counts by incrementing (act 1020) a digital number on the counter in response to a received signal 325. During a second portion of the exposure period (e.g., for a same time duration t), in each pixel of a plurality of pixels in the array, the counter configured for event-based imaging may continue accumulating counts by decrementing (act 1030) the digital number on the counter in response to a received signal 325. It should be appreciated that there may be no delay between the act 1020 and the act 1030 for high speed and low latency imaging.

The inventors have recognized and appreciated that a continuous counting in opposite directions during an exposure period enables the pixels to indicate a detected change when the resulting digital number has a non-zero value and/or exceeds a threshold level or is outside a range of values. The threshold level (or range of values) may correspond to a noise floor. The value of the digital number may also indicate a magnitude of the detected change. In some cases, the magnitude may be a magnitude above a noise floor. For a continuous counting, the digital number after the act 1020 is not reset to an initial count value before the act 1030.

It also should be appreciated that the present application is not limited to the illustrated order of act 1020 and act 1030. For example, the counter configured for event-based imaging may be configured to decrement a digital number and then increment the digital number. As another example, the first and second portions of the exposure period may be divided into sub-portions. In some embodiments, the counter configured for event-based imaging may be configured to switch between incrementing and decrementing a digital number between the sub-portions, without resetting or otherwise processing the digital number between the sub-portions of the exposure period. In some cases, the acts of incrementing and decrementing counts can be repeated multiple times during an exposure period, prior to ending (act 1040) exposure for the event image.

The lengths of the first portion and the second portion of the exposure period may be determined such that a pixel capturing a stationary object returns a zero and a pixel that has detected a change returns a non-zero value. In some embodiments, the first portion and the second portion of the exposure period may be proportioned such that background noise is removed and a pixel capturing a stationary object returns a zero. In some embodiments, the first portion and the second portion of the exposure period may be of a same duration (e.g., one half of the exposure period, one-quarter of an exposure period, one-twentieth of an exposure period, etc.). An advantageous aspect of the computational pixel imager is that the incrementing and decrementing portions can be programmed to any suitable value. Smaller values can allow for event detection of more rapidly changing events. For values less than one-half an exposure period, the incrementing and decrementing portions can be repeated multiple times during an exposure period. The method 1000 may include ending (act 1040) the exposure for the event image.

In some embodiments, the method 1000 may include identifying (act 1050) pixels of the array that have detected events. Identification of pixels that have detected events can be performed by, for example, logic circuitry. The logic circuitry and the event-based computational pixel imager may be on different substrates, or a same substrate. In some cases, the logic circuitry can be included in each pixel integrated circuit of a computational pixel imager.

Figure 11:
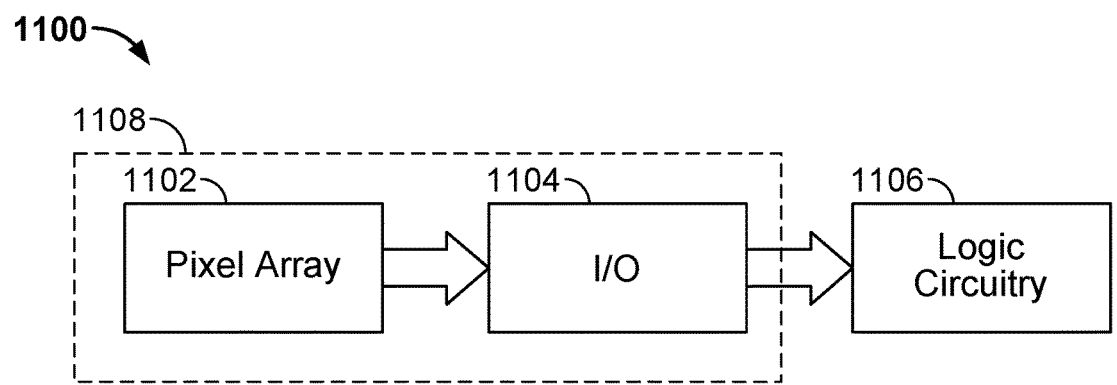
FIG. 11 depicts an example of reading out a pixel array for event-based imaging, according to some embodiments.

In some embodiments, all captured data may be transmitted off an event-based computational pixel imager, and processed by a separate circuitry (e.g., the controller 250). FIG. 11 depicts an example of an event-based computational pixel imaging system 1100, which may include an event-based computational pixel imager 1108. The event-based computational pixel imager 1108 may include a pixel array 1102 configured for event-based imaging as described above, and an input/output circuitry 1104 configured to read out the digital numbers of all pixels in the pixel array 1102 after individual image acquisition periods. The event-based computational pixel imaging system 1100 may include logic circuitry 1106 configured to receive the digital numbers from the event-based computational pixel imager 1108. The logic circuitry 1106 may be implemented in any suitable manner including, for example, a microprocessor, a microcontroller, a field-programmable gate array (FPGA) and an application-specific integrated circuit (ASCI).

The logic circuitry 1106 may be configured to determine whether the received digital numbers contain meaningful data content by, for example, comparing each of the received digital numbers with a threshold range (e.g., from −1 to +1, from −2 to +2, from −5 to +5, etc.). The threshold range may be programmable based on the environment of a scene such as lighting condition, indoor or outdoor, the amount of stationary objects, etc. The logic circuitry 1106 may set a digital number to zero or a selected null value (e.g., a gray level or selected color for display purposes) when the digital number is within the threshold range, which may indicate a high likelihood of background noise. In some embodiments, the signs of the received digital numbers may be dropped such that the absolute values of the digital numbers may be compared with a threshold value. In some implementations, the logic circuitry 1106 may be configured to add or subtract an offset value to or from the raw counter data to account for offsets in the imaging system.

The logic circuitry 1106 may assign and/or associate addresses to data for the pixels it identifies as containing meaningful non-zero digital numbers. The logic circuitry 1106 may further form an event image from the processed counter data. For example, meaningful pixel data may be packaged as image data for transmission to a processor for further data processing or for display as an event image or part of an event image. In some embodiments, an event image may include or be updated by a sparse data array containing information only from pixels that have detected events. The sparse data array may be compressed, such that there may be no data for at least some of the pixels in the array. In some embodiments, an event image may only include the pixel addresses. In some embodiments, an event image may include both the pixel addresses and the non-zero digital numbers of corresponding pixels. The non-zero digital numbers can indicate detected changes and thus an event image may also be referred to as a delta image. The meaningful non-zero data representative of detected events may be transmitted off the event-based computational pixel imaging system 1100 for further processing including, for example, inter-frame video compression as described below with respect to FIGS. 17-21 and/or display.

Figure 12:
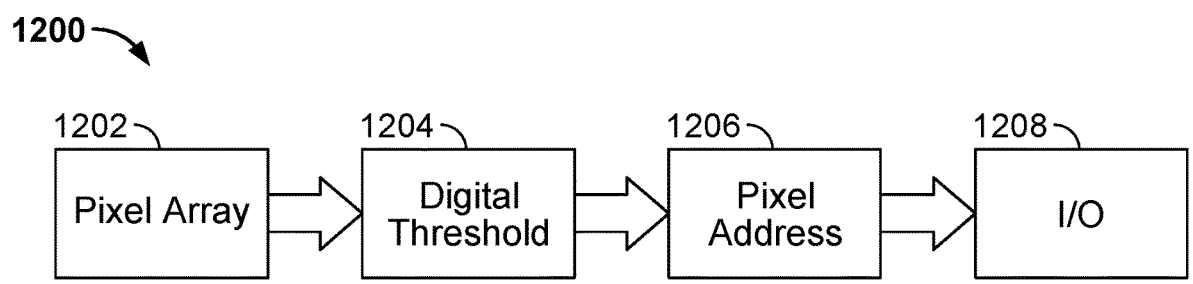
FIG. 12 depicts another example of reading out a pixel array for event-based imaging, according to some embodiments.

In some embodiments, an event-based computational pixel imager may include logic circuitry (e.g., in-pixel and/or at an edge of an array of pixel integrated circuits) that is configured to process the captured data to produce event images. FIG. 12 depicts such an event-based computational pixel imager 1200, according to some embodiments. The event-based computational pixel imager 1200 may include a pixel array 1202 configured for event-based imaging as described above, a digital threshold component 1204, a pixel address component 1206, and an input/output circuitry 1208 configured to output event images. In some embodiments, the digital threshold component 1204, pixel address component 1206, and input/output circuitry 1208 may be part of edge logic circuitry, for example, the data handlers 410, 412, 414, 416. The edge logic circuitry may be located on a same chip or substrate as an array 406 of pixel integrated circuits. The digital threshold component 1204 may be configured to determine whether a digital number on a counter represents meaningful event data (e.g., exceeds a threshold value or is outside a range of values). In some embodiments, the digital threshold component 1204 may also reset a counter's value to zero or a predetermined value when the counter's digital number does not represent meaningful event data (e.g., is within a range of values or does not exceed a threshold value), as described above with respect to the logic circuitry 1106. The pixel address component 1206 may be configured to assign and/or associate pixel addresses to event data for pixels whose counters contain meaningful non-zero digital numbers (e.g., have not been reset to zero or a predetermined value by the digital threshold component 1204). In some embodiments, the imager 1200 may operate in a low data rate mode by providing only the pixel addresses of pixels that have detected events without the values of the corresponding counters' digital numbers such that the amount of data transmitted off the imager is further reduced.

According to some embodiments, logic circuitry 1106 and digital threshold component 1204 may be configured to determine whether pixel data qualifies as meaningful data based on factors in addition to threshold comparison. For example, logic circuitry 1106 and digital threshold component 1204 may be configured to evaluate whether data from one or more adjacent pixels indicate an event and weigh a determination for a detected event in part on a number of detected events in adjacent pixels and in part on a threshold comparison for the pixel being evaluated. In some cases, a determination for a detected event at a pixel may be based, at least in part, on detected events for the pixel in one or more past event image frames. In some implementations, one or more threshold levels used by logic circuitry 1106 and digital threshold component 1204 may differ from one or more threshold levels used by in-pixel digital comparison circuitry described below in connection with FIG. 13 through FIG. 16.

Figure 13:
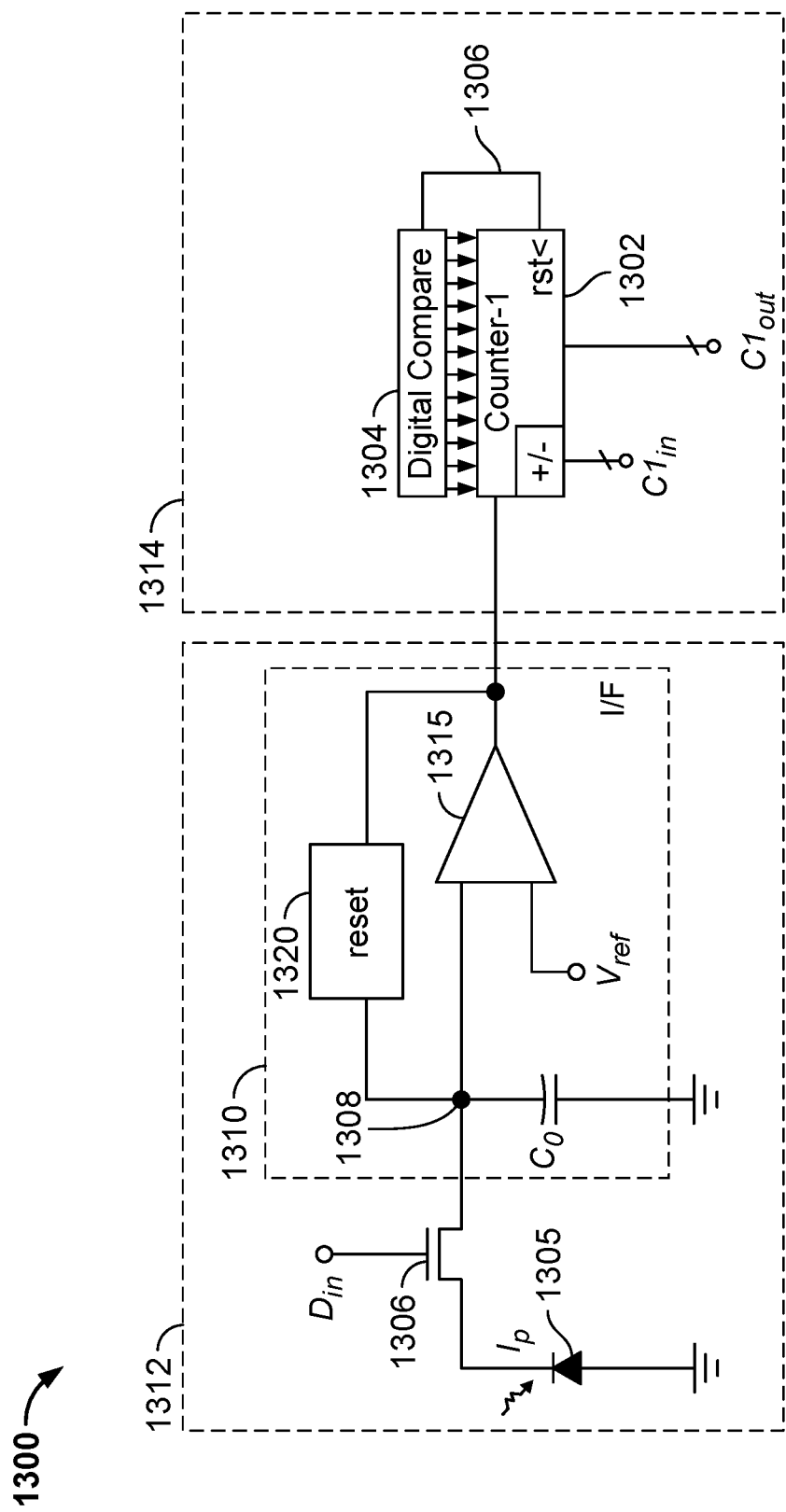
FIG. 13 depicts an example of pixel circuitry that is adapted for providing event data, according to some embodiments.

In some embodiments, a pixel integrated circuit may be configured to evaluate captured data, determine in-pixel whether the data is indicative of an event, and output data determined to be event data. FIG. 13 depicts such an example of pixel circuitry 1300, according to some embodiments. The pixel circuitry 1300 may include sensing circuitry 1312, which may be configured similar to corresponding circuitry of the pixel circuitry 120 in FIG. 3A. In the illustrated example, the sensing circuitry 1308 includes a photodiode 1305, a first transistor 1306, and a current-to-frequency converter 1310. Although not illustrated, the sensing circuitry 1308 may include a second transistor between the first transistor 1306 and the current-to-frequency converter 1310. The current-to-frequency converter 1310 may include a capacitor $C_0$, comparator circuitry 1315, and a reset circuitry 1320, according to some embodiments.

The pixel circuitry 1300 may include digitizing circuitry 1314 configured to receive an output of pulses from the sensing circuitry 1312. The digitizing circuitry 1314 may include a counter 1302 and a digital comparator 1304. The counter 1302 may receive control signals at $C1_{in}$, and operate in an event-based imaging mode based on the control signals. For example, the control signals may instruct the counter to decrement and increment counts during an exposure period, as described above. The digital comparator 1304 may be configured to compare a digital number of the counter 1302 with one or more threshold values (e.g., as described above with respect to, for example, the logic circuitry 1106 and/or the digital threshold component 1204) to determine whether a resulting count exceeds a threshold value or is outside a range of values. The digital comparator 1304 may provide a reset signal through interconnection 1306, which sets the digital number of the counter 1302 to zero or a selected value if the result of the digital comparison determines that an event has not been detected. The output $C1_{out}$ of the counter 1306 may be transmitted to an edge logic circuit, for example, to the digital threshold component 1204 and or the pixel address component 1206, for identifying pixels that have detected events and assigning/associating pixel addresses to event data. In some embodiments, the outputs of pixels in an imaging array may be serialized by multiplexers and sent off the imaging device.

In operation, the counter 1302 can be programmed to increment counts for a time t during an exposure period and decrement counts for a same time t during the exposure period. An end of the exposure period may trigger a digital comparison in pixel with comparator 1304 of the resulting count to one or more threshold values presented by the comparator 1304. If the comparison(s) output(s) one or more signals indicating that a threshold criterion has not been met (i.e., an event has not been detected), then the counter's value may be reset to zero or a selected initialized value for the next exposure period. Data from counters with non-zero values (or non-initialized values) can be transferred as a sparse image array to edge logic or off-chip logic (e.g., logic circuitry 1106 and/or the digital threshold component 1204) for further processing.

Figure 14:
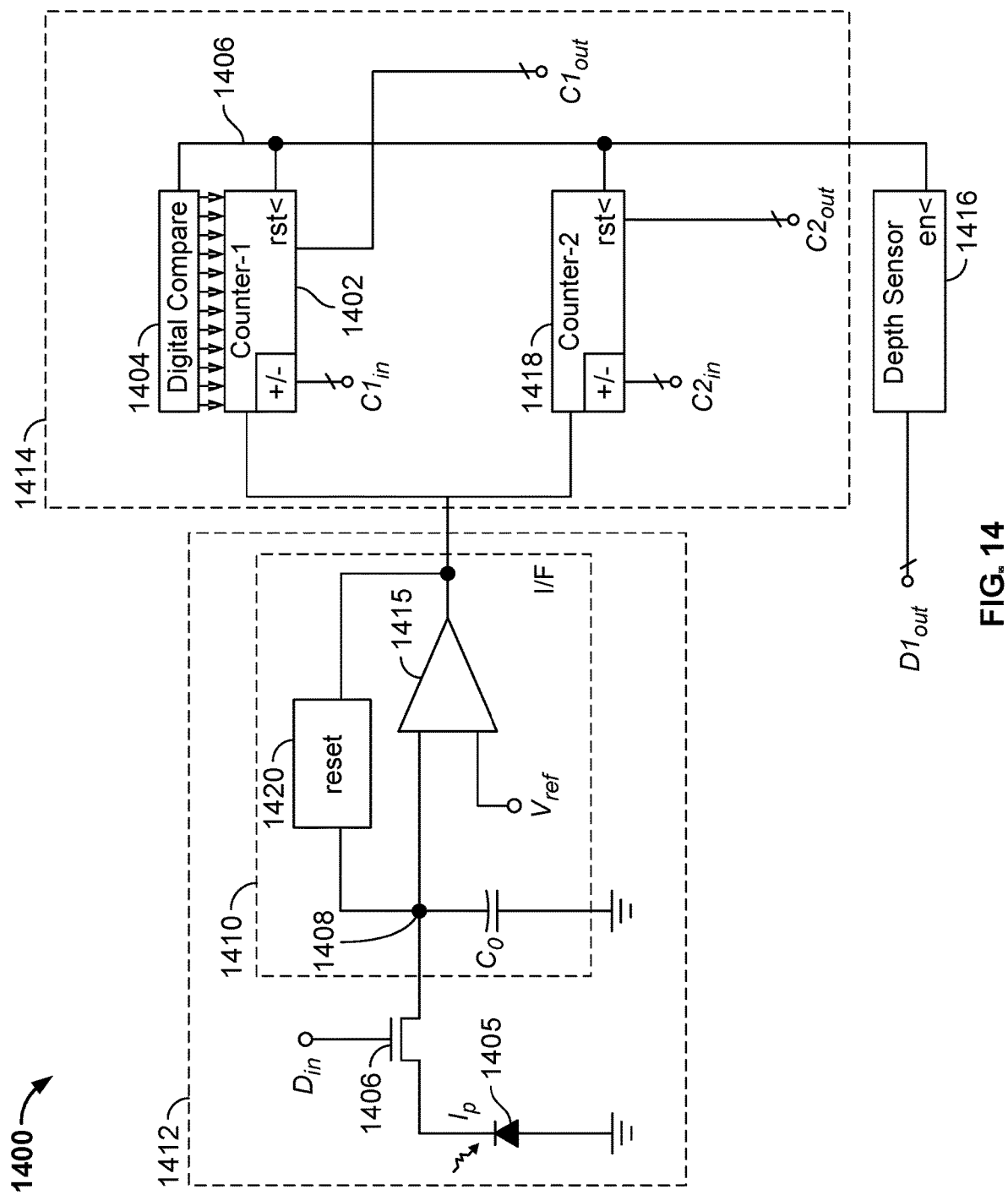
FIG. 14 depicts a second example of pixel circuitry that is adapted for providing event data, according to some embodiments.

In some embodiments, a pixel integrated circuit may be configured to operate in a normal imaging mode and in an event-based imaging mode simultaneously, which may enable data to be collected and read out at a same time. FIG. 14 depicts such an example of pixel circuitry 1400, according to some embodiments. The pixel circuitry 1400 may include sensing circuitry 1412, which may be configured similar to the sensing circuitry 1312.

The pixel circuitry 1400 may include digitizing circuitry 1414 configured to receive an output of pulses from the sensing circuitry 1412. The digitizing circuitry 1414 may include a digital comparator 1404, a first counter 1402, and a second counter 1418. Both counters 1402 and 1404 may receive the output of pulses from the sensing circuitry 1412. The first counter 1402 may be configured to detect events. The second counter 1404 may be configured to collect normal imaging data and/or detect events. The digital comparator 1404 may be configured to compare a digital number of the first counter 1402 with one or more threshold values as described above, and output a signal indicating whether or not an event has been detected by the pixel. The signal may be used as a reset or trigger signal. For example, the digital comparator 1404 may provide the output signal as a reset and/or triggering signal through one or more interconnection 1406. A reset signal (resulting from a determination that an event has not been detected) can be used to reset the digital numbers of the counters 1402 and 1418 to zero or a selected value. A trigger signal (resulting from a determination that an event has been detected in the pixel) may be used to activate one or more other counters in the pixel to collect additional data including, for example, conventional frame data, depth data, distance data, velocity data, etc. In the illustrated example, the reset signal enables a depth sensor 1416 that provides depth data $D1_{out}$. As with the embodiment of FIG. 13, resulting counter values may be transferred as sparse image data from one or both of the counters 1418, 1402 to edge logic or off-chip logic circuitry for further processing.

According to some implementations, the counters within a pixel can be programmed to start and stop counting at any time during an exposure period. As an example, a first counter 1402 may increment and decrement counts during a portion of an exposure period during which a second counter 1418 is continuously incrementing counts to obtain normal intensity image data. While the second counter 1418 is essentially integrating signal, a resulting count from the first counter 1402 can be processed and read to determine whether the pixel is detecting an event. Such read-while-integrate can eliminate signal acquisition dead times that would otherwise occur if the pixel contained only a single counter.

Figure 15:
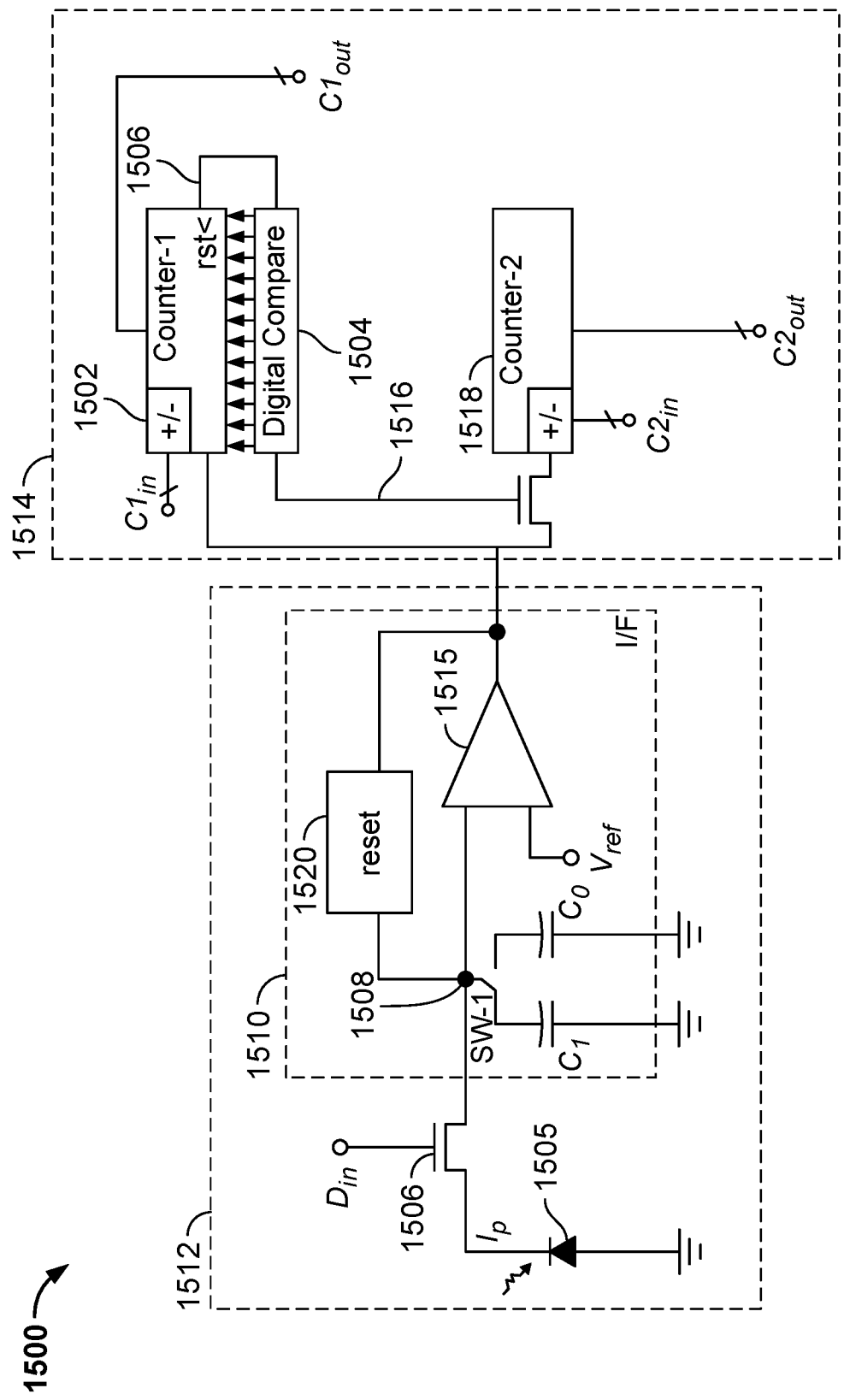
FIG. 15 depicts a third example of pixel circuitry that is adapted for providing event data, according to some embodiments.

In some embodiments, a pixel integrated circuit may be configured to operate in a low-power event-detection mode and switch to a higher power mode if an initial test at a pixel suggests an event has been detected. In this low-power mode, low-fidelity delta data may be continuously collected such that the pixels consume less power while being capable of detecting events. Once events are detected, higher-fidelity delta data collection may be triggered. The pixel circuitry may transmit high fidelity delta data off the imager but not the low fidelity delta data. FIG. 15 depicts an example of pixel circuitry 1500 that is adapted for a low-power event-detection mode, according to some embodiments.

The pixel circuitry 1500 may include sensing circuitry 1512, which may include components similar to corresponding components of the pixel circuitry 120 in FIG. 3A, for example, a photodiode 1505, a first transistor 1506, and a current-to-frequency converter 1510. The current-to-frequency converter 1510 may include a first capacitor $C_0$, a comparator circuitry 1515, and a reset circuitry 1520. Different from the current-to-frequency converter 310 in FIG. 3A, the current-to-frequency converter 1310 may include a switch SW-1 and an additional capacitor $C_1$. The second capacitor $C_1$ may be larger than the first capacitor $C_0$, for example, between 2 times and 100 times of $C_0$ or any suitable number in between. The sensing circuitry 1512 consumes less power when the large capacitor $C_1$ is being charged than when the small capacitor $C_0$ is being charged since the counting rate is lower. The amount of power saved by operating in this mode may depend on the value of the second capacitor $C_1$.

The switch SW-1 may be arrange to select one of the first capacitor $C_0$ and the second capacitor $C_1$ for charging by the photocurrent based on, for example, an operating condition of a digitizing circuitry 1514 of the pixel circuitry 1500. The digitizing circuitry 1514 may be configured to receive output pulses from the sensing circuitry 1512. The digitizing circuitry 1514 may include a digital comparator 1504, a first counter 1502, and a second counter 1518. The first counter 1502 may receive the output of pulses from the sensing circuitry 1512. The first counter 1502 and the digital comparator 1504 may be configured to detect events, for example, similar to the counter 1402 and the digital comparator 1404 in FIG. 14.

The digital comparator 1504 may provide an enabling signal through interconnection 1516 to the second counter 1518, which may be enabled when the first counter 1502 has detected an event. The enable signal may also be applied to switch SW-1. Once an event is detected, the switch SW-1 of the sensing circuitry 1512 may toggle to disable the large capacitor $C_1$ and enable the small capacitor $C_0$ such that an image with high signal-to-noise ratio can be captured. When enabled, the second counter 1510 may be configured to collect normal imaging data and/or event imaging data. As with the embodiment of FIG. 13, resulting counter values may be transferred as sparse image data from one or both of the counters 1518, 1502 to edge logic or off-chip logic circuitry for further processing.

Figure 16:
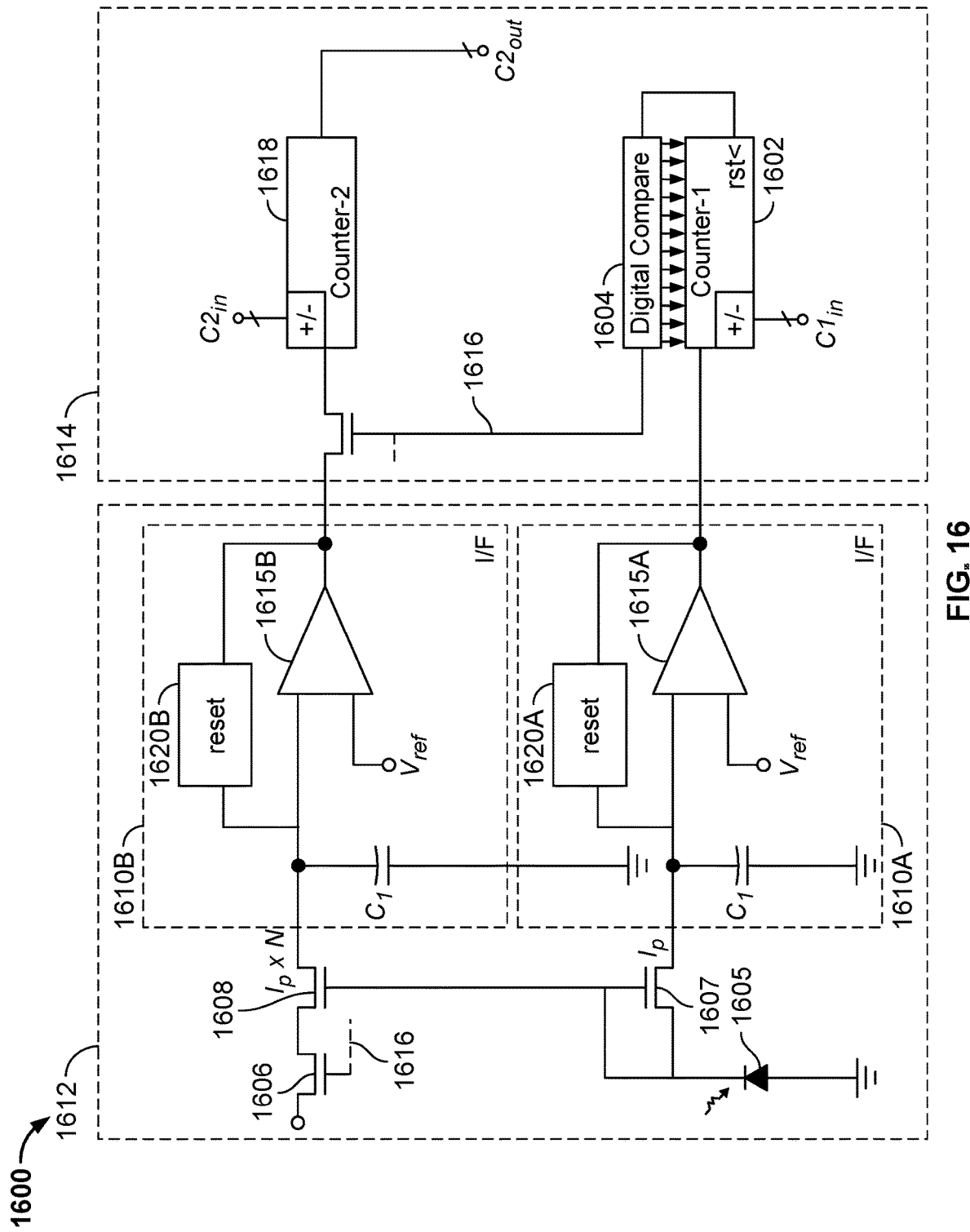
FIG. 16 depicts a fourth example of pixel circuitry that is adapted for providing event data, according to some embodiments.

FIG. 16 depicts another example of pixel circuitry 1600 that is adapted for low-power event-detection mode, according to some embodiments. The pixel circuitry 1600 may include sensing circuitry 1612 and digitizing circuitry 1614. The digitizing circuitry 1614 may be configured similar to the digitizing circuitry 1514 in FIG. 15. In the illustrated example, the digitizing circuitry 1614 includes a digital comparator 1604, a first counter 1602, and a second counter 1618. The first counter 1602 may receive the output of pulses from the sensing circuitry 1612. The first counter 1602 and the digital comparator 1604 may be configured to detect events. The digital comparator 1604 may provide an enabling signal through interconnection 1616 to the second counter 1618, which may be enabled when the first counter 1602 has detected an event.

The sensing circuitry 1612 may include a photodiode 1605, a first transistor 1606, and first and second current-to-frequency converters 1610A and 1610B. The second current-to-frequency converter 1610B may be enabled by the enabling signal from the digital comparator 1604 which can be applied to the first transistor 1606. The photodiode 1605 may be coupled to the first current-to-frequency converter 1610A through a second transistor 1607. The first transistor 1606 may be coupled to the second current-to-frequency converter 1610B through a third transistor 1608. The second transistor 1607 and the third transistor 1608 may be connected to form a current mirror amplifier. The photocurrent $I_p$ flowing through the second transistor 1607 may be amplified and mirrored to the third transistor 1608. The gain provided by the amplifier enables higher-fidelity delta data collection by the second counter 1618 through the second current-to-frequency converter 1610B. Upon detection of an event by the first counter 1602, the higher gain current-to-frequency converter 1610B and second counter 1618 can be activated to obtain image data with higher detection sensitivity.

The inventors have recognized and appreciated methods and apparatus for inter-frame video compression on a multi-mode, computational pixel imaging device, for example, the event-based computational pixel imager 1200 as described above. Conventional inter-frame video compression is processed down-stream, after collecting full frames, and by comparing successive full frames and generating change detection masks. A computational pixel imager is capable of on-imager, inter-frame video compression that can reduce down-stream processing by providing compressed image data directly off the imaging device.

In some embodiments, a multi-mode, computational pixel imaging device may collect key frames in a normal imaging mode and transmit the key frame data off the imager at a low frame rate. The imager can also collect delta frames in the event-based imaging mode, as described above, and transmit delta frame data off the imager at a higher frame rate but a much lower data rate that transfer of full frame data. Full high-rate motion video may be reconstructed using the key frames and delta frames. Unlike conventional event-based vision cameras that output asynchronous events, inter-frame video compression on a computational pixel imager can retain all context of a scene by augmenting the key frames with delta frames. Inter-frame video compression using a computational pixel imager can produce high-speed, low transmission bandwidth motion image video for various applications, such as those requiring rapid decision making.

Figure 17:
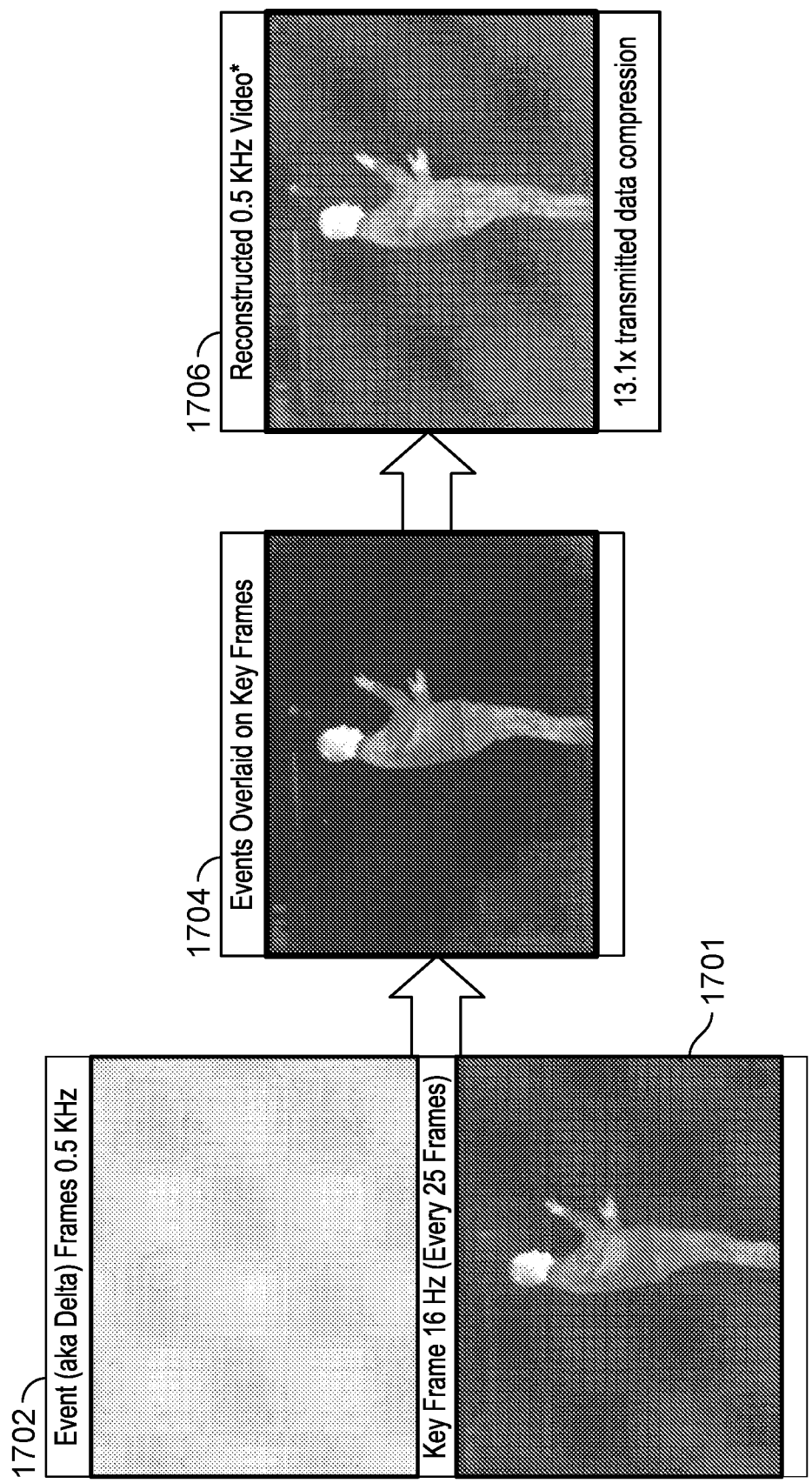
FIG. 17 illustrates captured images associated with inter-frame video compression and reconstruction, according to some embodiments.

FIG. 17 shows example images associated with inter-frame video compression and reconstruction, according to some embodiments. In various embodiments, a computational pixel imager can acquire two types of image data: key frame image data (for which data from one frame is rendered as a static key frame image 1701 depicted in the drawing), and event or delta frame image data (for which data from one frame is rendered as a static delta frame image 1702 depicted in the drawing). The key frames can be collected at a first frame rate (16 Hz in the example illustrated in FIG. 17), and the delta frames can be collected at a second frame rate (0.5 kHz in the example) that is faster than the first frame rate. Other frame rates can be used. The key frames can be collected by a computational pixel imaging device having counters in each pixel operating in a normal imaging mode. The delta frames can be collected by the computational pixel imaging device having counters in each pixel operating in any of the event-based imaging modes described above. An overlay of a key frame with delta frames is depicted as an overlay image 1704. Because the delta frames contain small amounts of data, the overlaid images are dominated by the key frame. However, motion of a tossed ball is visible in the overlaid image 1704.

The key frame and delta frame image data, as acquired, can be packaged for transmission off chip as temporally compressed video-image data. However, the acquired data may be filtered and/or processed on-chip, as described above, to improve signal and image quality. In some cases, the key frame and delta frame image data may be transmitted off the imager for down-stream processing by, for example, a controller 250 or other device. The compressed video-image data can be reconstructed into a video 1706 (illustrated as a static image) by a device adapted to render a video on a display, such as a television, computer, or smart phone. A video may be reconstructed by rendering a key frame and then updating pixels in the key frame in accordance with changes detected by the delta frames. The frame rate of the reconstructed video may be at the delta frame rate, which can be a much higher frame rate than conventional frame rates, since the delta frames contain significantly less data. Such compression and reconstruction enables transmitting and rendering of high-speed video with lower transmission bandwidth. For the illustrated example, the data compression was more than 13 compared to convention full-frame video transmission.

Figure 18A:
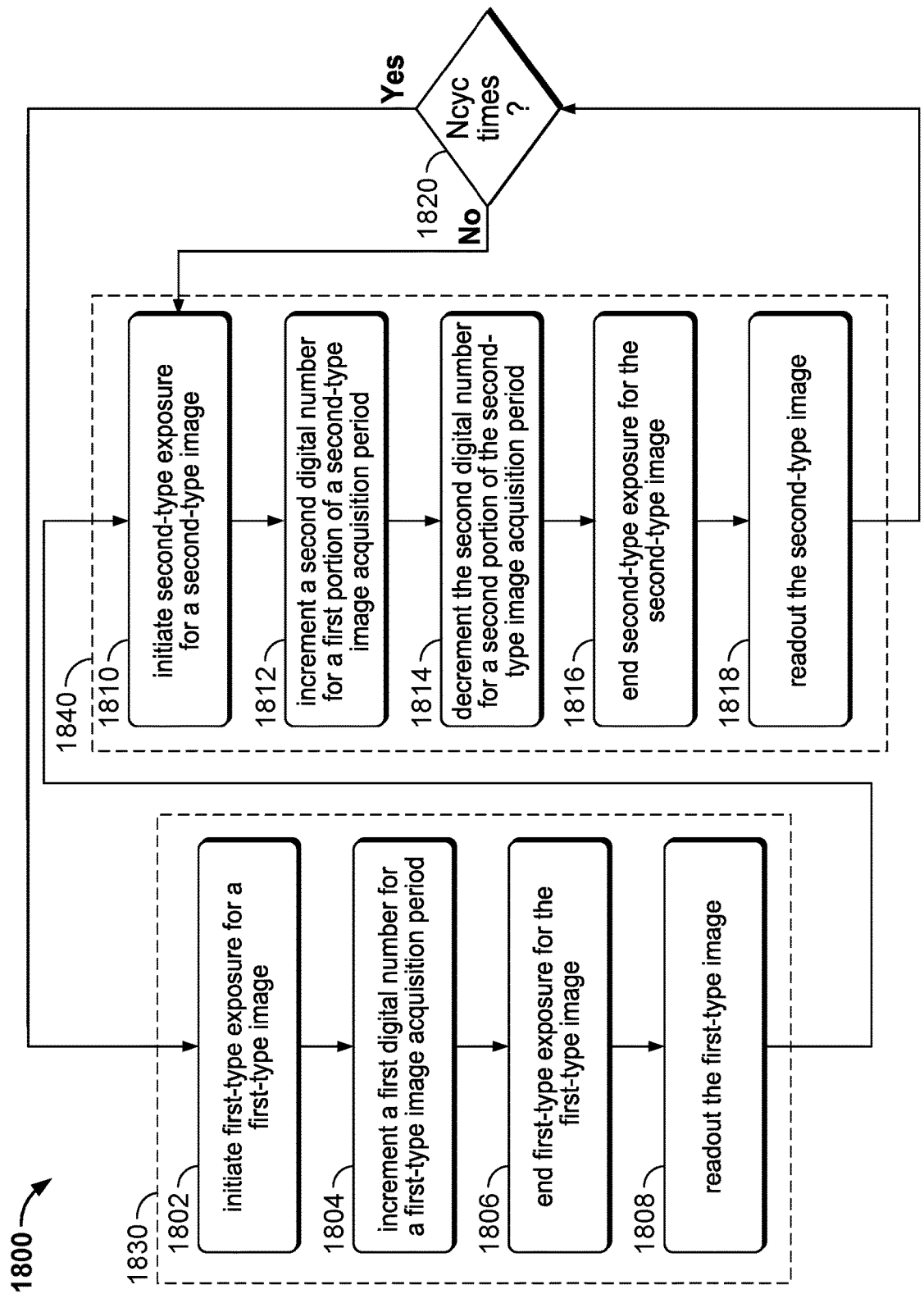
FIG. 18A illustrates acts associated with inter-frame video compression, according to some embodiments.
Figure 18B:
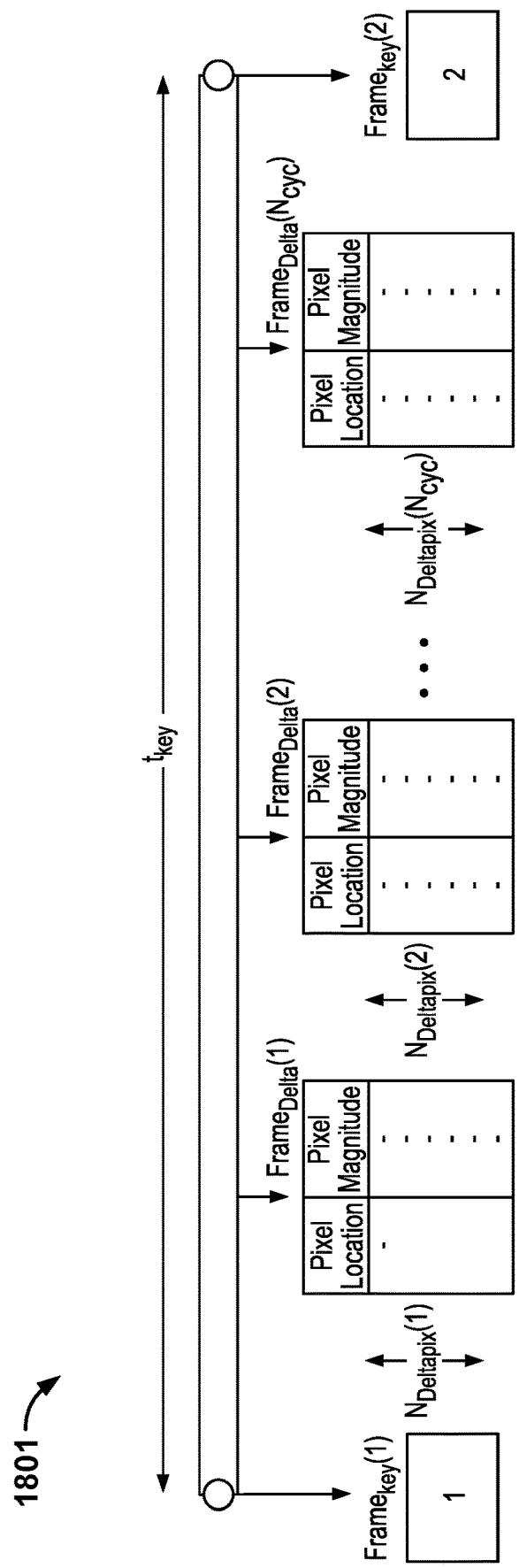
FIG. 18B depicts an example of compressed image data, according to some embodiments.

FIG. 18A illustrates acts associated with on-chip video compression performed with a computational pixel imaging device of the disclosed embodiments. FIG. 18B plots an example of compressed image data acquisition, according to some embodiments. On-chip video compression performed during image acquisition by a computational pixel imager may include a first thread 1830 of acts for acquiring key frames (e.g., Frame$_{key}$(1) and Frame$_{key}$(2) in FIG. 14B) and a second thread 1840 of acts for acquiring delta frames (e.g., Frame$_{Delta}$(1), Frame$_{Delta}$(2), . . . Frame$_{Delta}$(N$_{cyc}$)). The second thread 1840 for acquiring delta frames may be repeated for a number of times (N$_{cyc}$) between execution of first threads 1830 for acquiring key frames. The number (N$_{cyc}$) may be programmable and determined based, at least in part, on the desired speed of the video. A method 1800 for performing on-chip video compression during image acquisition may include determining (act 1820) whether a second thread 1840 for collecting delta frames has been repeated for the predetermine number of times.

The thread 1830 for acquiring key frames may start by initiating (act 1802) a first-type exposure for a key frame. At act 1804, counters in each pixel of an array may accumulate counts in a single direction, for example, incrementing a digital number or decrementing a digital number, for the entire period of a first-type exposure. At act 1806, the thread 1830 may end the first-type exposure for the key frame. At act 1808, the thread 1830 may including reading out the key frame by any suitable methods and apparatus described above. A key frame may include digital numbers from each pixel of the array, indicating the intensity of radiation captured by the pixel over the first-type exposure.

The thread 1840 for acquiring delta frames may start by initiating (act 1810) a second-type exposure for a delta frame. At act 1812, the counters in each pixel of the array may accumulate counts in one direction, for example, incrementing a digital number, for a first portion of a second-type exposure. At act 1814, the counters in each pixel of the array may accumulate counts in the opposite direction, for example, decrementing the digital number, for a second portion of the second-type exposure. At act 1816, the thread 1840 may end the second-type exposure for the delta frame. At act 1818, the thread 1840 may including reading out the delta frame by any suitable methods and apparatus described above. As described above with respect to FIGS. 10-16, a delta frame or event frame may include pixel address of the pixels that have detected a change over the second-type exposure. The delta frame may also include the digital numbers captured by those pixels, indicating a magnitude of changes detected.

Figure 19:
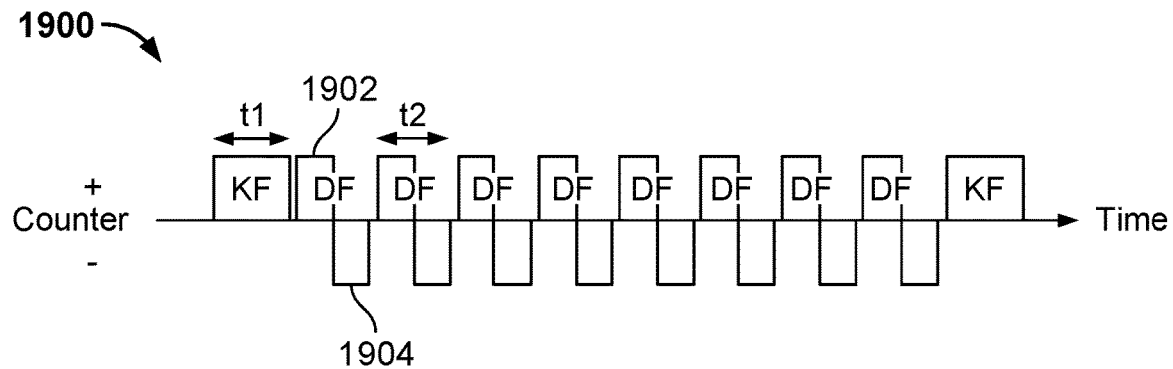
FIG. 19 plots an example of compressed image data acquisition timing by a single counter, according to some embodiments.

The act 1702 for acquiring compressed image data may be performed with a multi-mode, computational pixel imaging device that has one or more counters per pixel. FIG. 19 plots an example of compressed image data acquisition timing 1900 by a single counter, according to some embodiments. In the illustrated example, the compressed image data acquisition timing 1900 includes key frames captured by incrementing a digital number of the counter for a key-frame exposure period $t_1$, and delta frames captured by incrementing a digital number of the counter for a first portion 1902 of a delta-frame exposure period $t_2$ and decrementing the digital number of the counter for a second portion 1904 of the delta-frame exposure period $t_2$. A digital number of the counter is reset to an initial value after capturing a first frame (e.g., a key frame or a delta frame) and before capturing a second frame (e.g., a delta frame or a key frame). A digital number of the counter is not reset to an initial value during an exposure period (e.g., key-frame exposure period $t_1$, delta-frame exposure period $t_2$).

Figure 20:
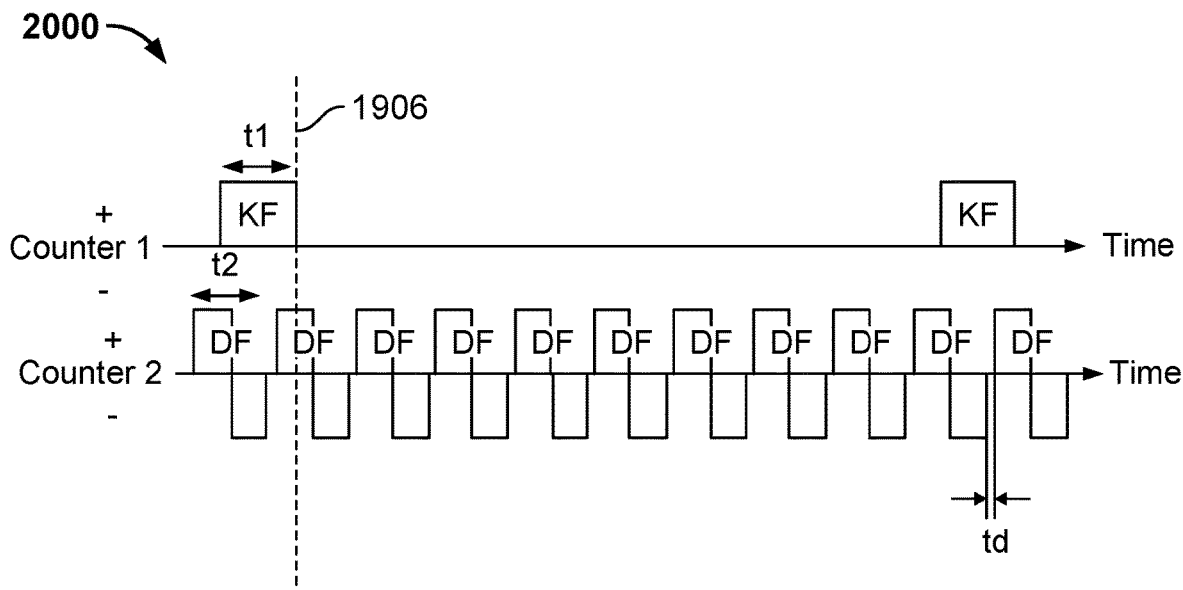
FIG. 20 plots an example of compressed image data acquisition timing by two counters, according to some embodiments.

FIG. 20 plots an example of compressed image data acquisition timing 2000 by two counters, according to some embodiments. In the illustrated example, the compressed image data 2000 includes key frames captured by incrementing a digital number of a first counter (Counter 1) for a key-frame exposure period $t_1$. The first counter may operate in the normal imaging mode. The compressed image data acquisition timing 2000 includes delta frames captured by a second counter (Counter 2) for a delta-frame exposure period $t_2$. The second counter may operate in the event-based imaging mode. The first and second counters may operate simultaneously. The delta frames captured by the second counter may be phase aligned with the key frames captured by the first counter such that motion artifacts in the resulting reconstructed video is reduced by, for example, aligning a particular phase of a delta frame (e.g., phase 1906 as illustrated) with a key frame. The particular phase alignment may enable that the processing time and/or display time between a key frame and a delta frame is substantially similar to the processing time and/or display time between a delta frame and another delta frame. It should be appreciated that there may be a down-time $t_d$ between two frames captured by a single counter configuration (e.g., due to image read-out and/or on-chip signal processing). The down-time may be an interval of time between exposure periods, for example. The two-counter configuration may remove any artifacts caused by the down-time. It should also be appreciated that more than two counters may be used for, for example, multi-thread processing as described above.

Figure 21:
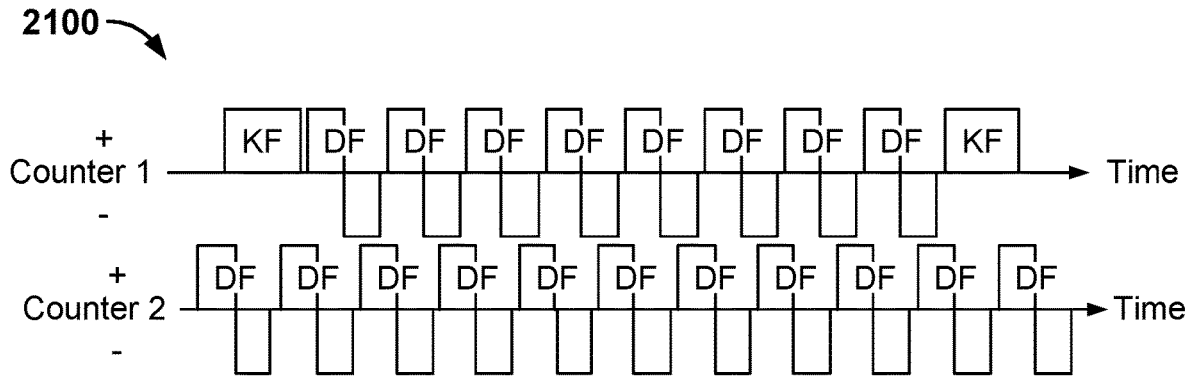
FIG. 21 plots another example of compressed image data acquisition timing by two counters, according to some embodiments.

FIG. 21 plots another example of compressed image data acquisition timing 2100 by two counters, according to some embodiments. Like the compressed image data acquisition timing 2000, the compressed image data acquisition timing 2100 includes key frames captured by a first counter and delta frames captured by a second counter. The compressed image data 2100 further includes delta frames captured by the first counter. This configuration may provide higher resolution when capturing the motion.

A computational pixel imaging apparatus can be embodied in different configurations. Example configurations include combinations of configurations (1) through (21) as described below.

(1) A computational pixel imaging apparatus for event-based imaging, comprising: a plurality of pixels, each pixel comprising; a signal converter configured to convert a received analog signal representative of received radiation to a sequence of pulses, and a first counter configured to, in response to the sequence of pulses, increment a digital number for a first portion of the exposure period and decrement the digital number for a second portion of the exposure period to accumulate a resulting first digital number; and logic circuitry configured to identify one or more pixels of the plurality of pixels that have detected changes in the received radiation based, at least in part, on one or more resulting first digital numbers on one or more of the first counters.

(2) The computational pixel imaging apparatus of configuration (1), wherein each pixel further comprises a detector configured to receive radiation during an exposure period and generate an analog signal in response to the received radiation.

(3) The computational pixel imaging apparatus of configuration (1) or (2), wherein the first portion and the second portion of the exposure period are of a same duration.

(4) The computational pixel imaging apparatus of any one of configurations (1) through (3), wherein the first portion and the second portion of the exposure period are each less than one-half the exposure period.

(5) The computational pixel imaging apparatus of any one of configurations (1) through (4), wherein the resulting first digital numbers indicate a magnitude of a change in radiation detected by respective pixels.

(6) The computational pixel imaging apparatus of any one of configurations (1) through (5), wherein the logic circuitry and the plurality of pixels are on separate substrates.

(7) The computational pixel imaging apparatus of configuration (6), wherein the logic circuitry is configured to: receive a resulting first digital number from at least one first counter; determine whether the received first digital number contains meaningful data indicating an event-based detection; and associate a pixel address with the received first digital number.

(8) The computational pixel imaging apparatus of any one of configurations (1) through (7), wherein the logic circuitry comprises: a digital threshold component configured to set a resulting first digital number on a first counter to zero when the resulting first digital number does not exceed a threshold or is within a threshold range; and a pixel address component configured to associate a pixel address with a resulting first digital number that exceeds a threshold or is outside a threshold range.

(9) The computational pixel imaging apparatus of configuration (8), wherein the logic circuitry is configured to transmit the pixel address off the computational pixel imaging apparatus.

(10) The computational pixel imaging apparatus of configuration (8) or (9), wherein the logic circuitry is configured to trigger a depth data collection component when a resulting first digital number exceeds a threshold or is outside a threshold range.

(11) The computational pixel imaging apparatus of any one of configurations (1) through (10), wherein the plurality of pixels each further comprises a digital comparator configured to set the resulting first digital number to zero when the resulting first digital number does not exceed a threshold or is within a threshold range.

(12) The computational pixel imaging apparatus of any one of configurations (1) through (11), wherein each pixel further comprises a second counter configured to, in response to the sequence of pulses, increment a second digital number for the exposure period.

(13) The computational pixel imaging apparatus of configuration (12), wherein the second counter is coupled to the first counter such that the second digital number is reset when the first digital number does not exceed a threshold or is within a threshold range.

(14) The computational pixel imaging apparatus of configuration (12) or (13), wherein the logic circuitry is configured to read out the resulting second digital number.

(15) The computational pixel imaging apparatus of any one of configurations (12) through (14), wherein the second counter can operate in a normal imaging mode and/or an event-based imaging mode.

(16) The computational pixel imaging apparatus of any one of configurations (1) through (15), wherein the converter comprises: a first capacitance of a first value; a second capacitance larger than the first capacitance; and a switch configured to select one of the first capacitance and the second capacitance for charging in response to the received analog signal.

(17) The computational pixel imaging apparatus of configuration (16), wherein each pixel further comprises a second counter, and wherein the first counter is enabled when the first capacitance is charging and the second counter is enabled when the second capacitance is charging.

(18) The computational pixel imaging apparatus of any one of configurations (1) through (17), wherein each pixel further comprises: an amplifier for amplifying the received analog signal; a second converter arranged to receive an amplified signal from the amplifier and configured to convert the amplified signal to a second sequence of pluses; and a second counter arranged to count the second sequence of pulses.

(19) The computational pixel imaging apparatus of configuration (18), further comprising a digital comparator arranged to enable the amplifier and second counter when a resulting first digital number exceeds a threshold or is outside a threshold range.

(20) The computational pixel imaging apparatus of configuration (18) or (19), further comprising: a first capacitance in the signal converter configured to be charged in response to the received analog signal; and a second capacitance in the second converter configured to be charged in response to the amplified signal.

(21) The computational pixel imaging apparatus of any one of configurations (18) through (20), wherein the second capacitance has a value essentially the same as the first capacitance.

A computational pixel imaging apparatus can be embodied in additional different configurations. Example configurations include combinations of configurations (22) through (33) as described below. Any of these configurations can include features from the above configurations.

(22) A computational pixel imaging apparatus, comprising: a plurality of pixels, each pixel comprising a detector configured to generate an analog signal when exposed to radiation and a pixel integrated circuit configured to convert the analog signal into at least one digital signal with at least one counter, wherein the plurality of pixels are configured to: acquire a plurality of key frames at a first frequency in response to exposure of the detectors of the plurality of pixels for a first-type exposure, and acquire a plurality of delta frames at a second frequency in response to exposure of the detectors of the plurality of pixels for a second-type exposure, wherein the second frequency is higher than the first frequency.

(23) The computational pixel imaging apparatus of configuration (22), wherein the plurality of delta frames comprise data from only pixels of the plurality of pixels that have detected event-base changes in the radiation received during the second-type exposure.

(24) The computational pixel imaging apparatus of configuration (22) or (23), further comprising read-out circuitry configured to transmit the plurality of key frames at the first frequency and the plurality of delta frames at the second frequency for reconstructing a video.

(25) The computational pixel imaging apparatus of any one of configurations (22) through (24), wherein the second frequency is a multiple of the first frequency.

(26) The computational pixel imaging apparatus of any one of configurations (22) through (25), wherein the second-type exposure is of the same duration.

(27) The computational pixel imaging apparatus of any one of configurations (22) through (26), wherein the pixel integrated circuit comprises: a signal converter configured to convert the analog signal to a sequence of pluses, and a first counter configured to, in response to the sequence of pluses, accumulate a first digital number.

(28) The computational pixel imager of configuration (27), wherein when acquiring a key frame, the first counter increments the first digital number for the first-type exposure.

(29) The computational pixel imager of configuration (28), wherein when acquiring a delta frame, the first counter increments the first digital number for a first portion of the second-type exposure and decrements the first digital number for a second portion of the second-type exposure.

(30) The computational pixel imager of any one of configurations (27) through (29), wherein the pixel integrated circuit further comprises a second counter configured to collect at least a portion of the plurality of the delta frames and when collecting the at least a portion of the plurality of the delta frames, the second counter, in response to the sequence of pluses, increments a second digital number for a first portion of the second-type exposure and decrements the second digital number for a second portion of the second-type exposure.

(31) The computational pixel imager of configuration (30), wherein the first counter and the second counter are configured to operate simultaneously.

(32) The computational pixel imager of configuration (30) or (31), wherein the second counter collects a first portion of the plurality of delta frames, the first counter collects a second portion of the plurality of delta frames, and when collecting the second portion of the plurality of delta frames, the first counter increments the first digital number for a first portion of the second-type exposure and decrements the first digital number for a second portion of the second-type exposure.

(33) The computational pixel imager of any one of configurations (22) through (32), wherein the plurality of the delta frames are phase aligned with the plurality of key frames such that motion artifacts in resulting reconstructed images from the plurality of key frames and plurality of delta frames are reduced.

Methods for operating a computational pixel imager of any of the above configurations can include various processes. Example methods include combinations of processes (34) through (35) as described below.

(34) A method for detecting events with a computation pixel imager, the method comprising: receiving photons at a detector in a pixel of the imager and generating an analog signal; converting, with a signal converter, the analog signal to a sequence of pulses; incrementing a count value with a counter for a first duration of time based on received pulses from the sequence of pulses; decrementing the count value to a resulting digital number with the counter for a second duration of time based on received pulses from the sequence of pulses; comparing the resulting digital number with a threshold value or range of values; and if the resulting digital number exceeds the threshold value or is outside the range of values, retain the retain the resulting digital number on the counter in the pixel for read out.

(35) The method of (34), further comprising resetting the resulting digital number to a predetermined value if the resulting digital number does not exceed the threshold value or is within the range of values.

CONCLUSION

Unless stated otherwise, the terms "approximately" and "about" are used to mean within ±20% of a target value in some embodiments, within ±10% of a target value in some embodiments, within ±5% of a target value in some embodiments, and yet within ±2% of a target value in some embodiments. The terms "approximately" and "about" can include the target value. The term "essentially" is used to mean within ±3% of a target value.

The technology described herein may be embodied as a method, of which at least some acts have been described. The acts performed as part of the method may be ordered in any suitable way. Accordingly, embodiments may be implemented in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A computational pixel imaging apparatus for event-based imaging, comprising:
   a plurality of pixels, each pixel comprising:
      a signal converter configured to convert a received analog signal representative of received radiation to a sequence of pulses, and
      a first counter configured to, in response to the sequence of pulses, increment a digital number for a first portion of the exposure period and decrement the digital number for a second portion of the exposure period to accumulate a resulting first digital number; and
   logic circuitry configured to identify one or more pixels of the plurality of pixels that have detected changes in the received radiation based, at least in part, on one or more resulting first digital numbers on one or more of the first counters, wherein the logic circuitry comprises:
      a digital threshold component configured to set a resulting first digital number on a first counter to zero when the resulting first digital number does not exceed a threshold or is within a threshold range; and
      a pixel address component configured to associate a pixel address with a resulting first digital number that exceeds a threshold or is outside a threshold range.

2. The computational pixel imaging apparatus of claim 1, wherein the logic circuitry is configured to transmit the pixel address off the computational pixel imaging apparatus.

3. The computational pixel imaging apparatus of claim 1, wherein the logic circuitry is configured to trigger a depth data collection component when a resulting first digital number exceeds a threshold or is outside a threshold range.

4. A computational pixel imaging apparatus for event-based imaging, comprising:
   a plurality of pixels, each pixel comprising:
      a signal converter configured to convert a received analog signal representative of received radiation to a sequence of pulses, and
      a first counter configured to, in response to the sequence of pulses, increment a digital number for a first portion of the exposure period and decrement the digital number for a second portion of the exposure period to accumulate a resulting first digital number; and
   logic circuitry configured to identify one or more pixels of the plurality of pixels that have detected changes in the received radiation based, at least in part, on one or more resulting first digital numbers on one or more of the first counters, wherein the plurality of pixels each further comprises a digital comparator configured to set the resulting first digital number to zero when the resulting first digital number does not exceed a threshold or is within a threshold range.

5. A computational pixel imaging apparatus for event-based imaging, comprising:
   a plurality of pixels, each pixel comprising:
      a signal converter configured to convert a received analog signal representative of received radiation to a sequence of pulses, and
      a first counter configured to, in response to the sequence of pulses, increment a digital number for a first portion of the exposure period and decrement the digital number for a second portion of the exposure period to accumulate a resulting first digital number; and
   logic circuitry configured to identify one or more pixels of the plurality of pixels that have detected changes in the received radiation based, at least in part, on one or more resulting first digital numbers on one or more of the first counters, wherein each pixel further comprises a second counter configured to, in response to the sequence of pulses, increment a second digital number for the exposure period.

6. The computational pixel imaging apparatus of claim 5, wherein the second counter is coupled to the first counter such that the second digital number is reset when the first digital number does not exceed a threshold or is within a threshold range.

7. The computational pixel imaging apparatus of claim 5, wherein the logic circuitry is configured to read out the resulting second digital number.

8. The computational pixel imaging apparatus of claim 5, wherein the second counter can operate in a normal imaging mode and/or an event-based imaging mode.

9. A computational pixel imaging apparatus for event-based imaging, comprising:
   a plurality of pixels, each pixel comprising:
      a signal converter configured to convert a received analog signal representative of received radiation to a sequence of pulses, wherein the signal converter comprises:
         a first capacitance of a first value;
         a second capacitance larger than the first capacitance; and
         a switch configured to select one of the first capacitance and the second capacitance for charging in response to the received analog signal; and
      a first counter configured to, in response to the sequence of pulses, increment a digital number for a first portion of the exposure period and decrement the digital number for a second portion of the exposure period to accumulate a resulting first digital number; and logic circuitry configured to identify one or more pixels of the plurality of pixels that have detected changes in the received radiation based, at least in part, on one or more resulting first digital numbers on one or more of the first counters.

10. The computational pixel imaging apparatus of claim 9, wherein each pixel further comprises a second counter, and wherein the first counter is enabled when the first capacitance is charging and the second counter is enabled when the second capacitance is charging.

11. A computational pixel imaging apparatus for event-based imaging, comprising:
a plurality of pixels, each pixel comprising:
a signal converter configured to convert a received analog signal representative of received radiation to a sequence of pulses;
an amplifier for amplifying the received analog signal;
a second converter arranged to receive an amplified signal from the amplifier and configured to convert the amplified signal to a second sequence of pluses; and
a second counter arranged to count the second sequence of pulses; and
a first counter configured to, in response to the sequence of pulses, increment a digital number for a first portion of the exposure period and decrement the digital number for a second portion of the exposure period to accumulate a resulting first digital number; and
logic circuitry configured to identify one or more pixels of the plurality of pixels that have detected changes in the received radiation based, at least in part, on one or more resulting first digital numbers on one or more of the first counters.

12. The computational pixel imaging apparatus of claim 11, further comprising a digital comparator arranged to enable the amplifier and second counter when a resulting first digital number exceeds a threshold or is outside a threshold range.

13. The computational pixel imaging apparatus of claim 11, further comprising:
a first capacitance in the signal converter configured to be charged in response to the received analog signal; and
a second capacitance in the second converter configured to be charged in response to the amplified signal.

14. The computational pixel imaging apparatus of claim 11, wherein the second capacitance has a value essentially the same as the first capacitance.

15. A method for detecting events with a computation pixel imager, the method comprising: receiving photons at a detector in a pixel of the imager and generating an analog signal; converting, with a signal converter, the analog signal to a sequence of pulses; incrementing a count value with a counter for a first duration of time based on received pulses from the sequence of pulses; decrementing the count value to a resulting digital number with the counter for a second duration of time based on received pulses from the sequence of pulses; comparing the resulting digital number with a threshold value or range of values; and if the resulting digital number exceeds the threshold value or is outside the range of values, retaining the resulting digital number on the counter in the pixel for read out.

16. The method of claim 15, further comprising resetting the resulting digital number to a predetermined value if the resulting digital number does not exceed the threshold value or is within the range of values.

\* \* \* \* \*